(12) United States Patent
Koga

(10) Patent No.: US 12,557,605 B2
(45) Date of Patent: Feb. 17, 2026

(54) SEMICONDUCTOR ELEMENT, SEMICONDUCTOR DEVICE INCLUDING THE SEMICONDUCTOR ELEMENT, AND SEMICONDUCTOR ELEMENT MANUFACTURING METHOD

(71) Applicant: ROHM Co., LTD., Kyoto (JP)

(72) Inventor: Yuji Koga, Kyoto (JP)

(73) Assignee: ROHM Co., LTD., Kyoto (JP)

( * ) Notice: Subject to any disclaimer, the term of this patent is extended or adjusted under 35 U.S.C. 154(b) by 427 days.

(21) Appl. No.: 17/665,019

(22) Filed: Feb. 4, 2022

(65) Prior Publication Data

US 2022/0254692 A1 Aug. 11, 2022

(30) Foreign Application Priority Data

Feb. 8, 2021 (JP) .................................. 2021-018284

(51) Int. Cl.
*H01L 21/66* (2006.01)
(52) U.S. Cl.
CPC .............. *H01L 22/32* (2013.01); *H01L 22/12* (2013.01)
(58) Field of Classification Search
CPC ......... H01L 22/12; H01L 22/30; H01L 22/32; H01L 23/544; H01L 23/481; H01L 23/522; H01L 2223/54426; H01L 24/81; H01L 24/13; H01L 24/16; H01L 2224/16
See application file for complete search history.

(56) References Cited

U.S. PATENT DOCUMENTS

| | | | | |
|---|---|---|---|---|
| 6,392,300 B1 * | 5/2002 | Koike | ................. | H01L 23/5258 257/E23.179 |
| 2005/0067722 A1 * | 3/2005 | Koike | .................. | H01L 23/544 257/E23.179 |
| 2009/0272973 A1 * | 11/2009 | Yoshida | ................... | H01L 22/32 257/E23.179 |
| 2010/0078769 A1 * | 4/2010 | West | ..................... | H01L 23/562 257/E23.179 |
| 2013/0105965 A1 | 5/2013 | Shyu | | |

(Continued)

FOREIGN PATENT DOCUMENTS

JP 2002-305131 10/2002
JP 2004172169 6/2004

(Continued)

OTHER PUBLICATIONS

Notice of Reasons for Refusal cited in Japanese Application No. 2021018284, mailed Nov. 26, 2025.

*Primary Examiner* — Ajay Ojha
(74) *Attorney, Agent, or Firm* — CHIP Law Group LLP

(57) ABSTRACT

Provided is a semiconductor element including a semiconductor substrate; a semiconductor layer laminated to the semiconductor substrate, and having a circuit formed within the semiconductor layer; a conductive layer disposed on an opposite side of the semiconductor layer from the semiconductor substrate and including a part electrically connected to the circuit; and a conductive portion disposed between the semiconductor layer and the conductive layer, and electrically connected to the conductive layer. The conductive layer includes a check pattern not electrically connected to the circuit, and the conductive portion includes a superimposition portion superimposed on the check pattern as viewed in a thickness direction of the semiconductor substrate.

17 Claims, 24 Drawing Sheets

(56) References Cited

U.S. PATENT DOCUMENTS

| | | | | |
|---|---|---|---|---|
| 2015/0243605 | A1* | 8/2015 | Yasumura | H01L 25/50 |
| | | | | 438/15 |
| 2017/0084544 | A1* | 3/2017 | Chen | H01L 23/544 |
| 2022/0285234 | A1* | 9/2022 | Yokomizo | H01L 24/80 |
| 2023/0223387 | A1* | 7/2023 | Lee | H01L 23/5389 |
| | | | | 257/668 |

FOREIGN PATENT DOCUMENTS

| | | |
|---|---|---|
| JP | 2005-109145 | 4/2005 |
| JP | 2006344956 | 12/2006 |
| JP | 2013058584 | 3/2013 |
| JP | 2019-114673 | 7/2019 |
| WO | WO2015/068597 | 3/2017 |

\* cited by examiner

SEMICONDUCTOR ELEMENT, SEMICONDUCTOR DEVICE INCLUDING THE SEMICONDUCTOR ELEMENT, AND SEMICONDUCTOR ELEMENT MANUFACTURING METHOD

CROSS REFERENCE TO RELATED APPLICATIONS

This application claims priority benefit of Japanese Patent Application No. JP 2021-018284 filed in the Japan Patent Office on Feb. 8, 2021. Each of the above-referenced applications is hereby incorporated herein by reference in its entirety.

BACKGROUND

The present disclosure relates to a semiconductor element, a semiconductor device including the semiconductor element, and a semiconductor element manufacturing method.

A semiconductor element is manufactured by forming a semiconductor layer, electrodes, a protective layer, and the like on a semiconductor substrate, and dividing the semiconductor substrate by dicing. WO2015/068597 discloses a semiconductor element manufacturing method, and describes manufacturing a semiconductor element by forming a semiconductor film, a dielectric film, a protective film, a bonding pad, and the like on a silicon-based substrate, and cutting the substrate in a dicing region.

In a step of manufacturing the semiconductor element, a check pattern for inspection is formed to inspect appropriateness of arrangement of a formed resist. The check pattern may not be necessary for a completed product. The check pattern is therefore formed in a dicing region to be removed by dicing in a cutting step. When the check pattern includes a hard metal, chipping may occur during dicing. Therefore, a region that is not a main pattern for the semiconductor element (which region will hereinafter be referred to as a "drop-in region") is provided within one shot of a photomask, and a pattern for inspection is disposed in the drop-in region. In this case, a semiconductor element that does not become a product in the drop-in region is produced for each shot, so that the number of semiconductor elements obtained is decreased. In a case where 30 main patterns, for example, can be arranged within one shot without the drop-in region being provided, the number of semiconductor elements obtained is reduced to 29 by providing the drop-in region. The number of semiconductor elements obtained is thus decreased by 3% or more.

SUMMARY

The present disclosure has been devised under the above-described circumstances. It is desirable to provide a semiconductor element that makes it possible to suppress chipping and suppress a decrease in the number of semiconductor elements obtained in a manufacturing process.

According to an embodiment of the present disclosure, there is provided a semiconductor element including a semiconductor substrate; a semiconductor layer laminated to the semiconductor substrate, and having a circuit formed within the semiconductor layer; a conductive layer disposed on an opposite side of the semiconductor layer from the semiconductor substrate and including a part electrically connected to the circuit; and a conductive portion disposed between the semiconductor layer and the conductive layer, and electrically connected to the conductive layer; the conductive layer including a check pattern not electrically connected to the circuit, the conductive portion including a superimposition portion superimposed on the check pattern as viewed in a thickness direction of the semiconductor substrate.

According to an embodiment of the present disclosure, there is provided a semiconductor element manufacturing method including laminating, to a semiconductor substrate, a semiconductor layer having a circuit formed within the semiconductor layer and a passivation film; forming a plurality of vias penetrating the passivation film; and forming a conductive layer including a part electrically connected to the circuit via the plurality of vias, the conductive layer including a check pattern not electrically connected to the circuit, the plurality of vias including vias constituting a superimposition portion superimposed on the check pattern as viewed in a thickness direction of the semiconductor substrate, the forming the conductive layer including forming a seed layer in contact with the passivation film, forming, on the seed layer, a resist having a plurality of openings for forming the conductive layer, and checking positional relation between a check opening for forming the check pattern among the plurality of openings and the superimposition portion located in the check opening by a visual check from the thickness direction.

According to the semiconductor element in the embodiment of the present disclosure, chipping is suppressed and a decrease in the number of semiconductor elements obtained can be suppressed in a manufacturing process.

Other features and advantages of the present disclosure will become more apparent by the following detailed description with reference to the accompanying drawings.

DETAILED DESCRIPTION OF THE PREFERRED EMBODIMENTS

Figure 1:
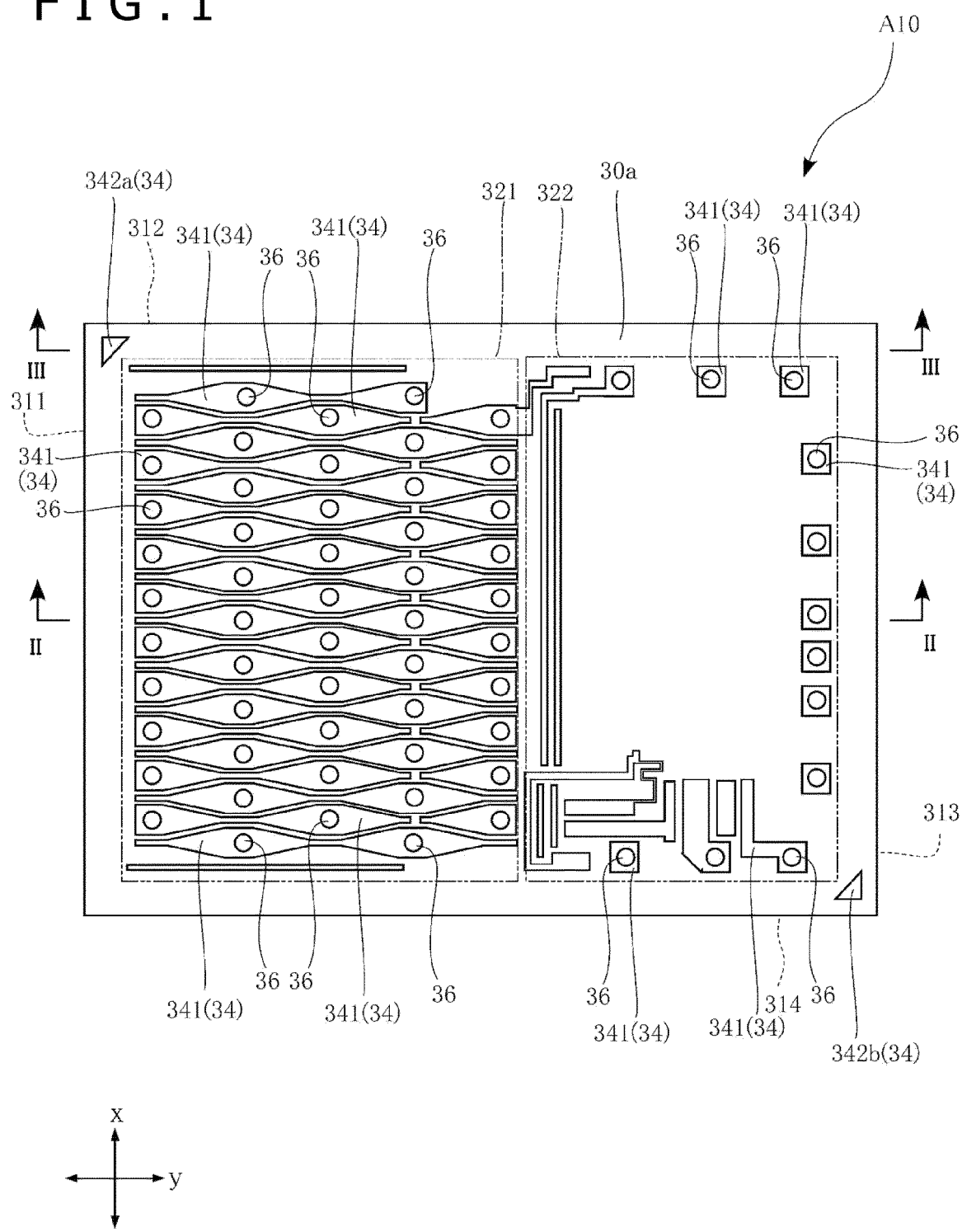
FIG. 1 is a plan view illustrating a semiconductor element according to a first embodiment of the present disclosure and is a diagram in which a protective layer is made transparent.

Preferred embodiments of the present disclosure will hereinafter be described concretely with reference to the accompanying drawings.

In the present disclosure, unless otherwise noted, a "certain object A being formed at a certain object B" and the "certain object A being formed on the certain object B" includes the "certain object A being directly formed at the certain object B" and the "certain object A being formed at the certain object B while another object is interposed between the certain object A and the certain object B." Similarly, unless otherwise noted, the "certain object A being disposed at the certain object B" and the "certain object A being disposed on the certain object B" includes the "certain object A being directly disposed at the certain object B" and the "certain object A being disposed at the certain object B while another object is interposed between the certain object A and the certain object B." Similarly, unless otherwise noted, the "certain object A being located on the certain object B" includes the "certain object A being located on the certain object B with the certain object A in contact with the certain object B" and the "certain object A being located on the certain object B while another object is interposed between the certain object A and the certain object B." In addition, unless otherwise noted, the "certain object A being superimposed on the certain object B as viewed in a certain direction" includes the "certain object A being superimposed on all of the certain object B" and the "certain object A being superimposed on a part of the certain object B."

First Embodiment

FIGS. 1 to 7 illustrate an example of a semiconductor element according to the present disclosure. A semiconductor element A10 according to a present embodiment includes a semiconductor substrate 31, a semiconductor layer 32, a passivation film 33, a conductive layer 34, an insulating layer 35, a plurality of electrode terminals 36, a plurality of internal electrodes 37, and a plurality of vias 38. The semiconductor element A10 is a flip chip large scale integration (LSI) having a circuit formed therewithin.

Figure 2:
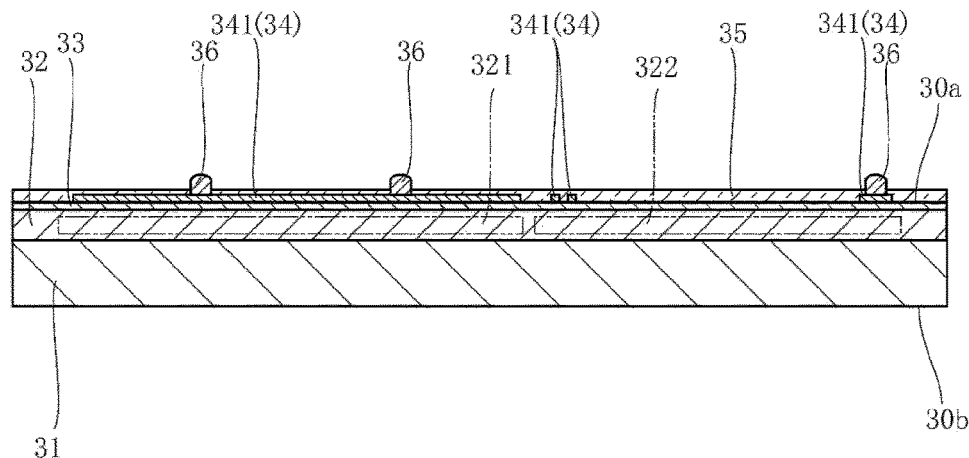
FIG. 2 is a sectional view taken along a line II-II in FIG. 1.
Figure 2:
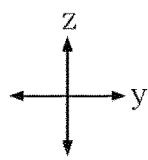
Figure 3:
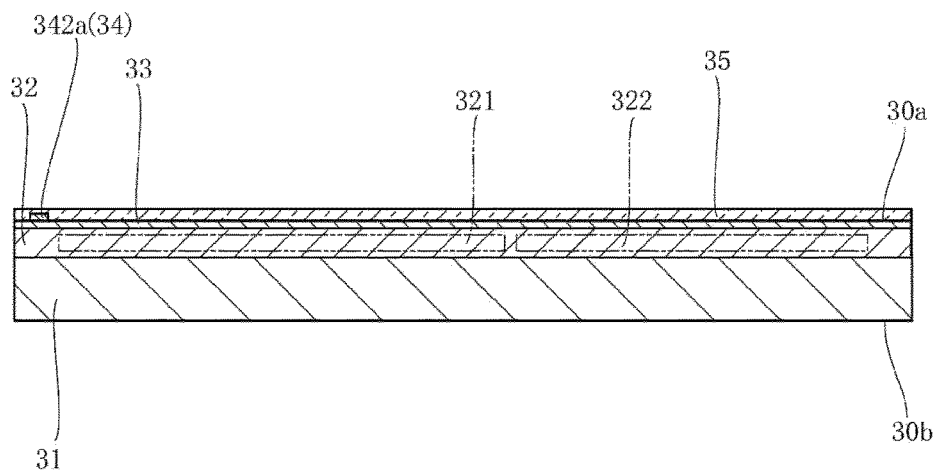
FIG. 3 is another sectional view taken along a line III-III in FIG. 1.
Figure 3:
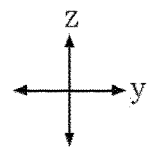
Figure 4:
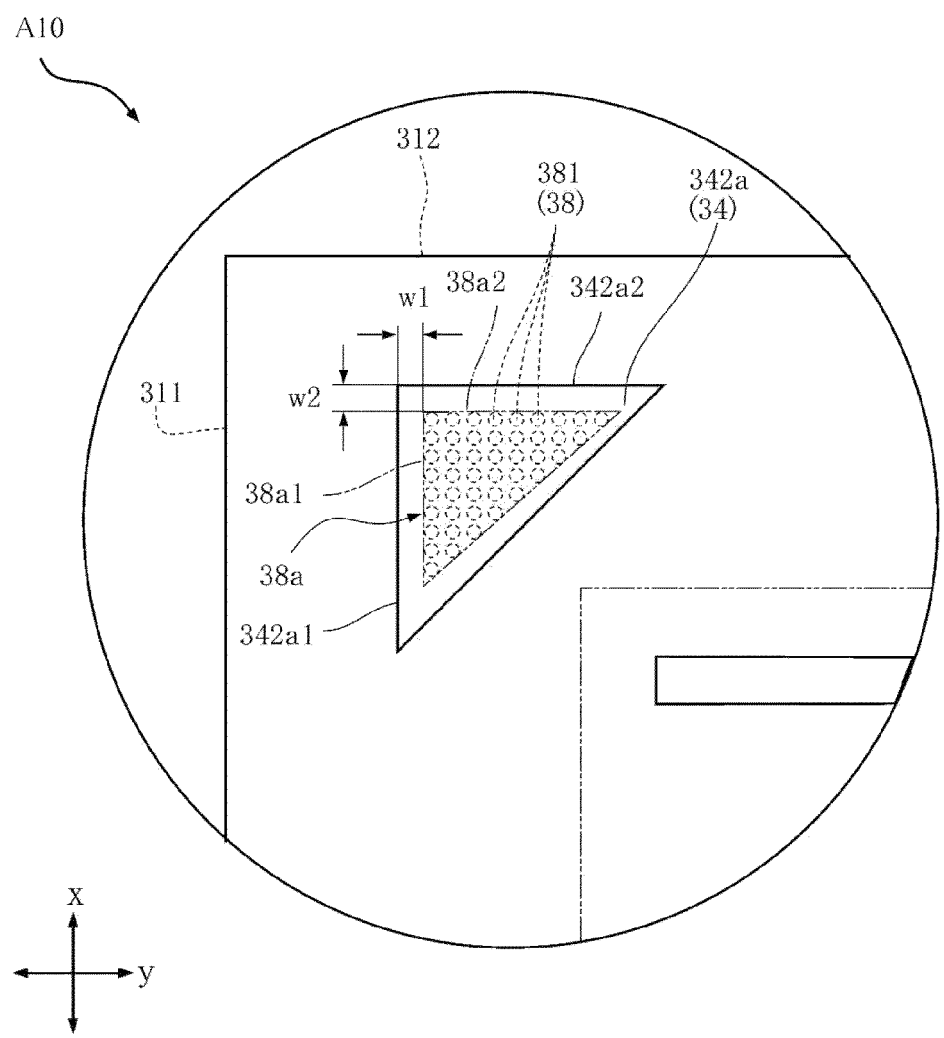
FIG. 4 is a fragmentary enlarged view of FIG. 1.
Figure 5:
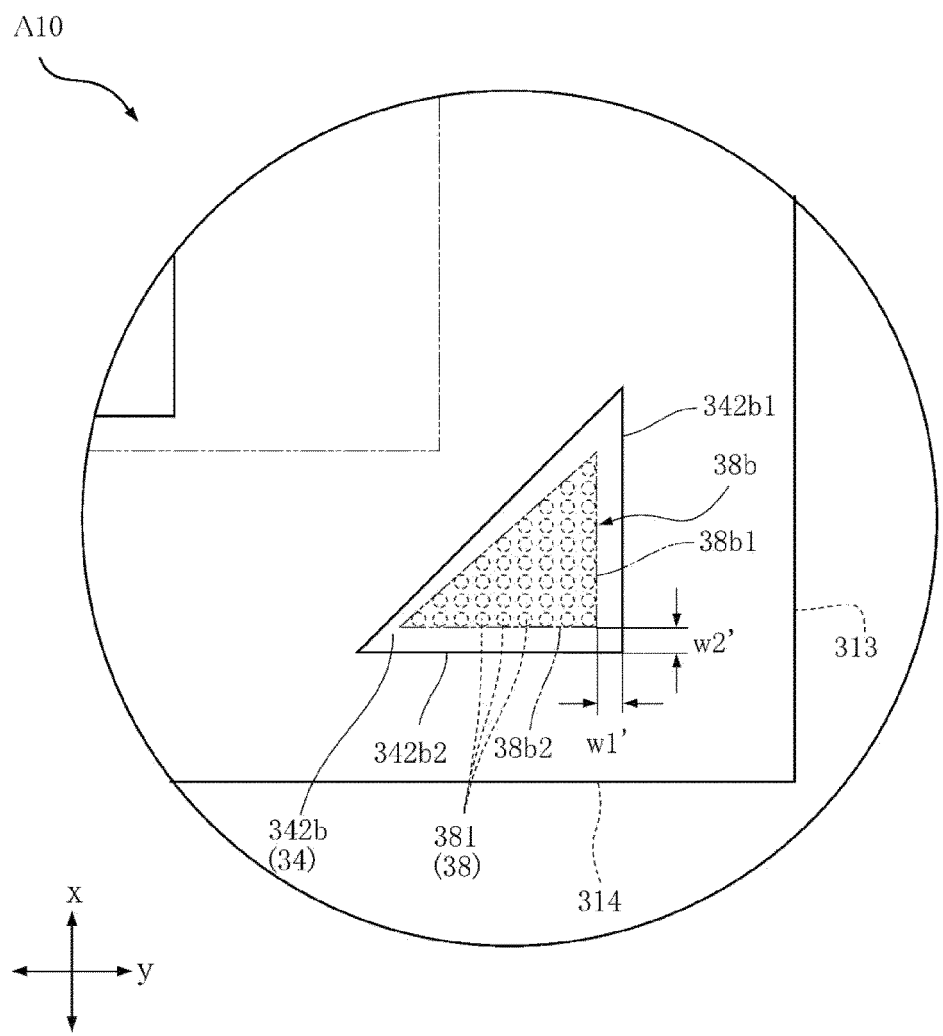
FIG. 5 is a fragmentary enlarged view of FIG. 1.
Figure 6:
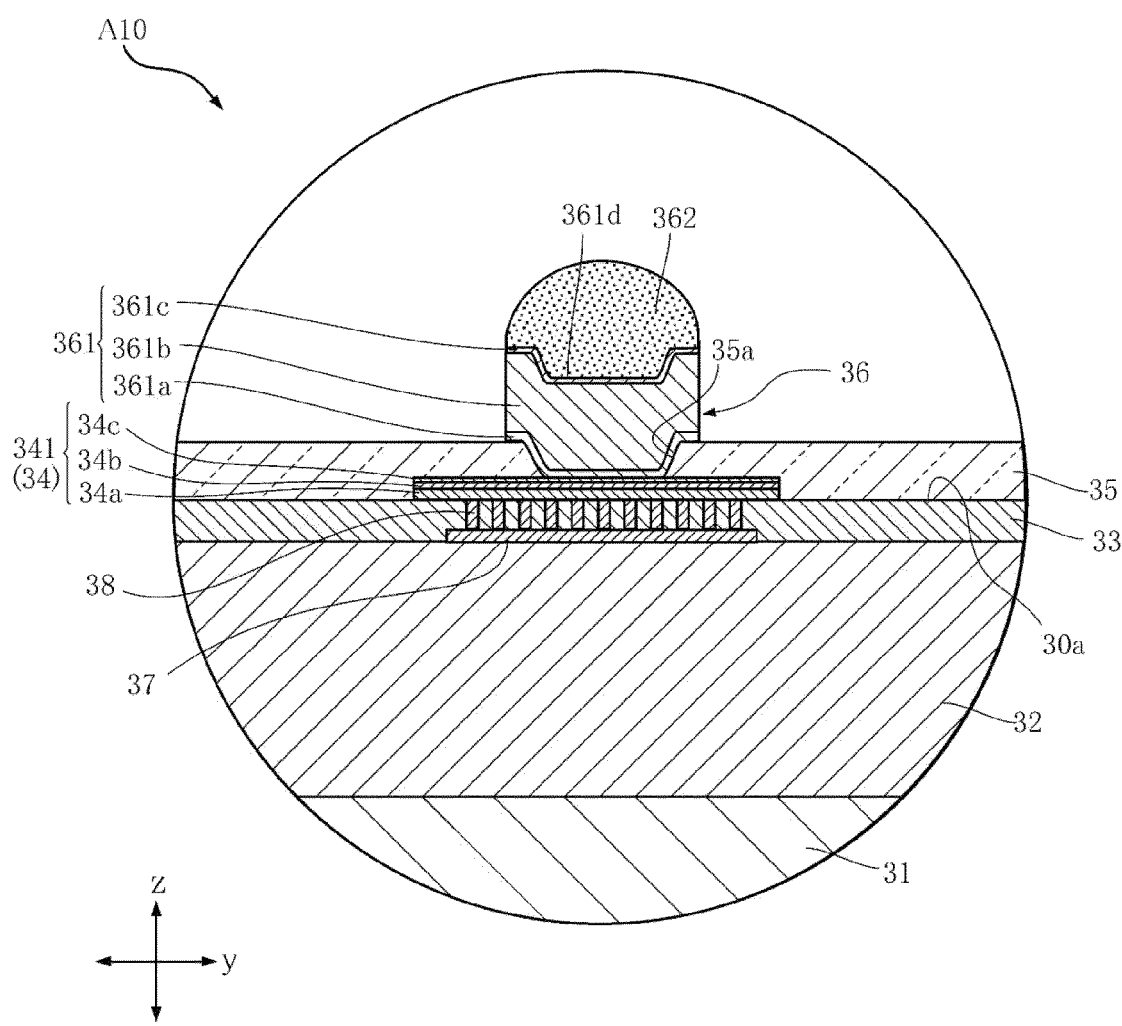
FIG. 6 is a fragmentary enlarged view of FIG. 2.
Figure 7:
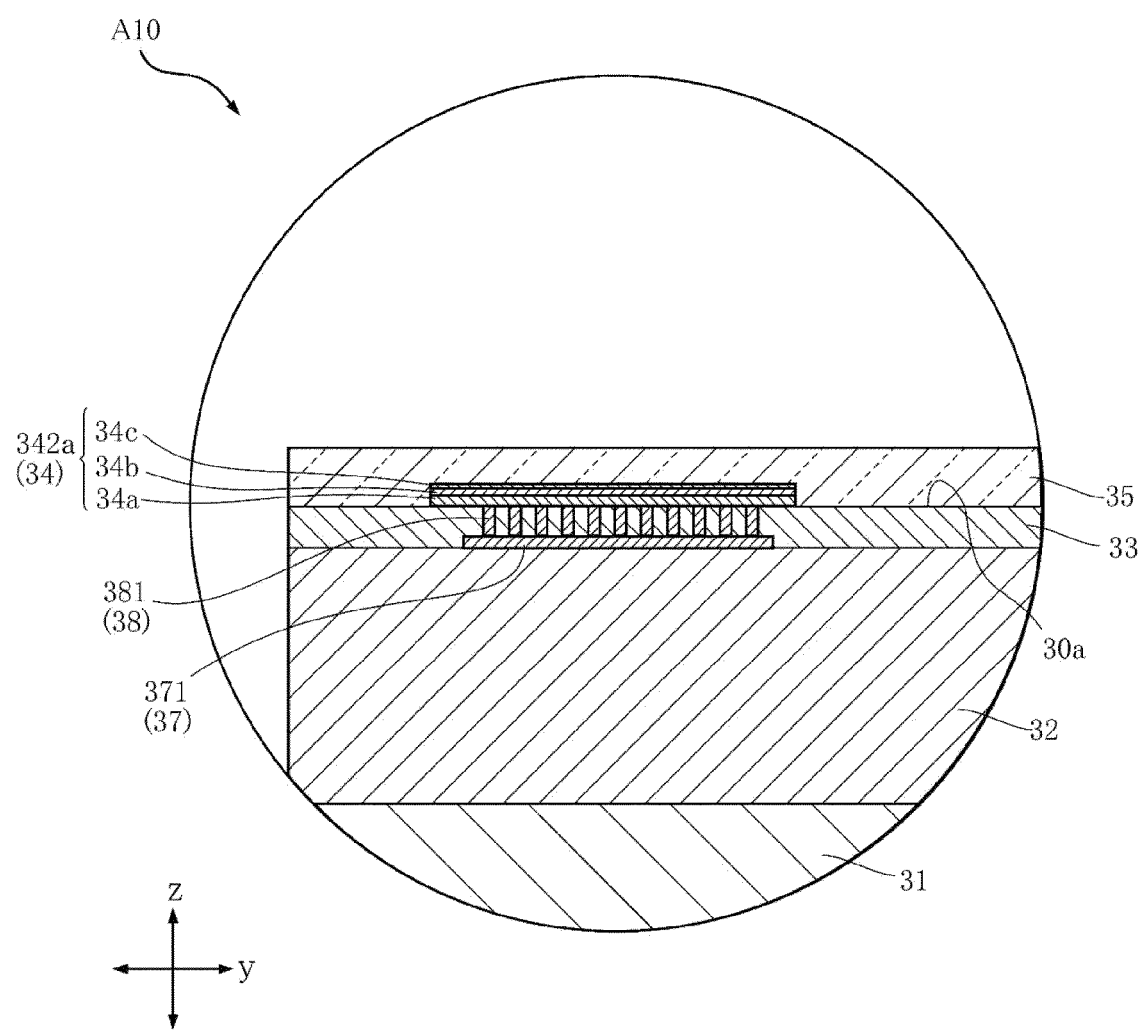
FIG. 7 is a fragmentary enlarged view of FIG. 3.

FIG. 1 is a plan view illustrating the semiconductor element A10. In FIG. 1, for the convenience of understanding, the insulating layer 35 is made transparent. FIG. 2 is a sectional view taken along a line II-II in FIG. 1. FIG. 3 is a sectional view taken along a line III-III in FIG. 1. FIG. 4 is a fragmentary enlarged view of FIG. 1 (around a check pattern 342a to be described later). FIG. 5 is a fragmentary enlarged view of FIG. 1 (around a check pattern 342b to be described later). FIG. 6 is a fragmentary enlarged view of FIG. 2 (around an electrode terminal 36). FIG. 7 is a fragmentary enlarged view of FIG. 3 (around the check pattern 342a).

The semiconductor element A10 has a plate shape, and has a rectangular shape as a shape as viewed in a thickness direction (as viewed in plan). For the convenience of description, the thickness direction (plan view direction) of the semiconductor element A10 will be referred to as a z-direction, a direction (upward-downward direction in FIG. 1) along one side of the semiconductor element A10 which direction is orthogonal to the z-direction will be referred to as an x-direction, and a direction (left-right direction in FIG. 1) orthogonal to the z-direction and the x-direction will be referred to as a y-direction. The z-direction corresponds to the "thickness direction" in the present disclosure. The x-direction corresponds to a "first direction" in the present disclosure. The y-direction corresponds to a "second direction" in the present disclosure. It is to be noted that the shape and dimensions of the semiconductor element A10 are not limited.

The semiconductor element A10 has an element principal surface 30a and an element undersurface 30b. The element principal surface 30a and the element undersurface 30b face opposite sides from each other in the z-direction. The element principal surface 30a is a surface facing one side in the z-direction (upper side in FIGS. 2 and 3). The element principal surface 30a is a surface on which a plurality of electrodes 341 and the plurality of electrode terminals 36 to be described later are arranged, and which is flip chip mounted on a circuit board or the like. The element undersurface 30b is a surface facing another side in the z-direction (lower side in FIGS. 2 and 3).

As illustrated in FIGS. 2 and 3, the semiconductor substrate 31 is provided with the semiconductor layer 32, the passivation film 33, the conductive layer 34, the insulating layer 35, and the plurality of electrode terminals 36 on one side in the z-direction of the semiconductor substrate 31 (which side will hereinafter be described as an "upper side"). A constituent material of the semiconductor substrate 31 is, for example, silicon (Si) or silicon carbide (SiC). In the present embodiment, a surface of the semiconductor substrate 31 which surface is on an opposite side from a side on which the semiconductor layer 32 is laminated constitutes the element undersurface 30b. As illustrated in FIG. 1, the semiconductor substrate 31 has a substrate first side 311, a substrate second side 312, a substrate third side 313, and a substrate fourth side 314. The substrate first side 311, the substrate second side 312, the substrate third side 313, and the substrate fourth side 314 are the sides of a surface of the semiconductor substrate 31 which surface is on the side where the semiconductor layer 32 is laminated. The substrate first side 311 and the substrate third side 313 extend in the x-direction. The substrate second side 312 and the substrate fourth side 314 extend in the y-direction. The substrate first side 311 and the substrate second side 312 are orthogonal to each other.

As illustrated in FIGS. 2 and 3, the semiconductor layer 32 is laminated on the upper side in the z-direction of the semiconductor substrate 31. The semiconductor layer 32 includes a p-type semiconductor and an n-type semiconductor of a plurality of kinds based on a difference in amounts of elements with which doping is performed. A switching circuit 321 and a control circuit 322 electrically connected to the switching circuit 321 are formed in the semiconductor layer 32. The switching circuit 321 is a metal-oxide-semiconductor field-effect transistor (MOSFET), an insulated gate bipolar transistor (IGBT), or another transistor. In the present embodiment, the switching circuit 321 is divided into two regions, that is, a high voltage region (upper arm circuit) and a low voltage region (lower arm circuit). Each of the regions is formed by one re-channel MOSFET. The control circuit 322 includes a gate driver for driving the switching circuit 321, a bootstrap circuit corresponding to the high voltage region of the switching circuit 321, and other circuits, and performs control for normally driving the switching circuit 321. Incidentally, the semiconductor layer 32 further includes a wiring layer (not illustrated). The wiring layer electrically connects the switching circuit 321 and the control circuit 322 to each other.

As illustrated in FIGS. 2 and 3, the passivation film 33 covers a surface on the upper side in the z-direction of the semiconductor layer 32. The passivation film 33 has an electric insulating property. The passivation film 33 is, for example, constituted by a silicon oxide film ($SiO_2$) in contact with the semiconductor layer 32 and a silicon nitride film ($Si_3N_4$) laminated on the silicon oxide film. In the present embodiment, a surface of the passivation film 33 which surface is on an opposite side from the semiconductor layer 32 constitutes the element principal surface 30a.

As illustrated in FIGS. 6 and 7, the plurality of internal electrodes 37 are arranged at appropriate positions between the semiconductor layer 32 and the passivation film 33. Most of the internal electrodes 37 are connected to the wiring layer of the semiconductor layer 32 and are thus electrically connected to the switching circuit 321 and the control circuit 322. In the present embodiment, the plurality of internal electrodes 37 include Al and are formed by electroless plating, for example. It is to be noted that the material and forming method of the plurality of internal electrodes 37 are not limited. In addition, the shape and arrangement position of each internal electrode 37 are not limited.

The plurality of internal electrodes 37 include a plurality of internal electrodes 371 (see FIG. 7). The plurality of internal electrodes 371 are not connected to the wiring layer of the semiconductor layer 32. In the present embodiment, the semiconductor element A10 includes two internal electrodes 371. The internal electrodes 371 are respectively arranged at positions at which a check pattern 342 to be described later is disposed in an upper left corner portion of the semiconductor element A10 in FIG. 1 and a lower right corner portion on a diagonal line of the upper left corner portion. It is to be noted that the number, arrangement position, and shape of the internal electrodes 371 are not limited.

As illustrated in FIGS. 6 and 7, the plurality of vias 38 are formed so as to penetrate the passivation film 33 and be in contact with the internal electrodes 37. The plurality of vias 38 are conductors that electrically connect the internal electrodes 37 arranged in contact with the semiconductor layer 32 and the conductive layer 34 disposed on the element principal surface 30a to each other. The vias 38 are formed by forming through holes penetrating the passivation film 33 and communicating with the internal electrodes 37, and forming a conductor including tungsten (W) or Cu, for example, on the inner walls of the through holes. The shape as viewed in the x-direction and the shape as viewed in the y-direction of each of the vias 38 is a rectangular shape. The plurality of vias 38 correspond to a "conductive portion" in the present disclosure.

As illustrated in FIG. 7, the plurality of vias 38 include a plurality of vias 381. The plurality of vias 381 are vias that are in contact with the internal electrodes 371 among the plurality of vias 38. A part of the plurality of vias 381 are in contact with the internal electrode 371 disposed in the upper left corner portion of the semiconductor element A10 in FIG. 1. As illustrated in FIG. 4, a superimposition portion 38a as an aggregate of these vias has, as a general shape as viewed in the z-direction, the shape of a right triangle having a superimposition portion first side 38a1 (indicated by a chain double-dashed line in FIG. 4) parallel with the substrate first side 311 and a superimposition portion second side 38a2 (indicated by a chain double-dashed line in FIG. 4) parallel with the substrate second side 312. In addition, the rest of the plurality of vias 381 are in contact with the internal electrode 371 disposed in the lower right corner portion of the semiconductor element A10 in FIG. 1. As illustrated in FIG. 5, a superimposition portion 38b as an aggregate of these vias has, as a general shape as viewed in the z-direction, the shape of a right triangle having a superimposition portion first side 38b1 (indicated by a chain double-dashed line in FIG. 5) parallel with the substrate third side 313 and a superimposition portion second side 38b2 (indicated by a chain double-dashed line in FIG. 5) parallel with the substrate fourth side 314.

As illustrated in FIGS. 1 to 3, the conductive layer 34 is formed on the element principal surface 30a. In the present embodiment, as illustrated in FIGS. 6 and 7, the conductive layer 34 is formed by a plurality of metallic layers laminated on the passivation film 33, and includes a first layer 34a, a second layer 34b, and a third layer 34c. The first layer 34a is in contact with the passivation film 33 and is formed of Cu. The second layer 34b is in contact with the first layer 34a and is formed of Ni. The third layer 34c is in contact with the second layer 34b and is formed of Pd. It is to be noted that the configuration of the conductive layer 34 is not limited. The conductive layer 34 is in contact with the plurality of vias 38 arranged in the passivation film 33, and are electrically connected to the plurality of internal electrodes 37 via the plurality of vias 38. As illustrated in FIG. 1, the conductive layer 34 includes a plurality of electrodes 341 and a plurality of check patterns 342.

The plurality of electrodes 341 are each electrically connected to one of the switching circuit 321 and the control circuit 322 in the semiconductor layer 32. As illustrated in FIG. 1, a plurality of electrodes 341 formed in a region superimposed on the switching circuit 321 as viewed in the z-direction have a relatively large area, and are arranged close to each other. The shapes as viewed in the z-direction of these electrodes 341 in the present embodiment include, for example, a shape obtained by coupling two substantially rhombic shapes long in the y-direction to each other in the y-direction, a shape obtained by coupling a substantially rhombic shape long in the y-direction and a substantially triangular shape long in the y-direction to each other, and a substantially triangular shape long in the y-direction. A plurality of electrodes 341 formed in a region superimposed on the control circuit 322 as viewed in the z-direction have a relatively small area, and are each arranged in isolation. The shapes as viewed in the z-direction of these electrodes 341 include, for example, a rectangular shape and a shape having a part extending from a rectangular shape. It is to be noted that the shape and arrangement of each electrode 341 are not limited. As illustrated in FIG. 6, the plurality of electrodes 341 are each connected to an internal electrode 37 connected to the wiring layer of the semiconductor layer 32 via the plurality of vias 38. The plurality of electrodes 341 are each thereby electrically connected to one of the switching circuit 321 and the control circuit 322 in the semiconductor layer 32.

The plurality of check patterns 342 are intended for inspection as to whether the conductive layer 34 can be formed at a correct position in a process of forming the conductive layer 34 in a manufacturing process to be described later. In the present embodiment, as illustrated in FIG. 1, two check patterns 342 are arranged. The plurality of check patterns 342 include a check pattern 342a and a check pattern 342b.

As illustrated in FIG. 1, the check pattern 342a is disposed at the upper left corner portion of the semiconductor element A10 (semiconductor substrate 31) as viewed in the z-direction. As illustrated in FIG. 4, the check pattern 342a is superimposed on the superimposition portion 38a as viewed in the z-direction, and includes the superimposition portion 38a. In addition, the check pattern 342a has, as a shape as viewed in the z-direction, the shape of a right triangle having a check first side 342a1 parallel with the substrate first side 311 and the superimposition portion first side 38a1 and a check second side 342a2 parallel with the substrate second side 312 and the superimposition portion second side 38a2. Though not limited, the length of the check first side 342a1 and the check second side 342a2 in the present embodiment is approximately 100 μm, for example. In the present embodiment, an interval w1 between the check first side 342a1 and the superimposition portion 38a falls within a predetermined range (for example, equal to or more than 20 μm and equal to or less than 30 μm). An interval w2 between the check second side 342a2 and the superimposition portion 38a also falls within a predetermined range (for example, equal to or more than 20 μm and equal to or less than 30 μm). Incidentally, the ranges of w1 and w2 are not limited.

As illustrated in FIG. 1, the check pattern 342b is disposed at the lower right corner portion of the semiconductor element A10 (semiconductor substrate 31) as viewed in the z-direction. That is, the check pattern 342a and the check pattern 342b are arranged at the respective corner portions on a diagonal line in the semiconductor element A10 (semiconductor substrate 31). The check pattern 342b is superimposed on the superimposition portion 38b as viewed in the z-direction, and includes the superimposition portion 38b. In addition, the check pattern 342b has, as a shape as viewed in the z-direction, the shape of a right triangle having a check first side 342b1 parallel with the substrate third side 313 and the superimposition portion first side 38b1 and a check second side 342b2 parallel with the substrate fourth side 314 and the superimposition portion second side 38b2. In the present embodiment, an interval w1' between the check first side 342b1 and the superimposition portion 38b falls within a predetermined range (for example, equal to or more than 20 μm and equal to or less than 30 μm). An interval w2' between the check second side 342b2 and the superimposition portion 38b also falls within a predetermined range (for example, equal to or more than 20 μm and equal to or less than 30 μm). Incidentally, the ranges of w1' and w2' are not limited.

As illustrated in FIG. 7, each check pattern 342 is connected to the internal electrode 371 not connected to the wiring layer of the semiconductor layer 32 via the plurality of vias 381, and is thus not electrically connected to the switching circuit 321 nor the control circuit 322 in the semiconductor layer 32. It is to be noted that the number, arrangement position, and shape as viewed in the z-direction of each check pattern 342 are not limited. For example, the shape as viewed in the z-direction of each check pattern 342 may be another shape such as a rectangular shape, a circular shape, or a sectorial shape. However, a triangular shape such as a right triangular shape is preferable because the area of the corner can be used effectively.

As illustrated in FIGS. 2 and 3, the insulating layer 35 is formed on the element principal surface 30a, is in contact with the passivation film 33 and the conductive layer 34, and covers most of the passivation film 33 and the conductive layer 34. The insulating layer 35 has an electric insulating property. A constituent material of the insulating layer 35 in the present embodiment is a phenolic resin. It is to be noted that the constituent material of the insulating layer 35 is not limited, but may, for example, be another insulating material such as a polyimide resin. As illustrated in FIG. 6, the insulating layer 35 has a plurality of openings 35a penetrating in the z-direction. One electrode 341 is exposed from each of the plurality of openings 35a. The insulating layer 35 is, for example, formed by applying a photolithography technology to a photosensitive resin material applied by a spin coater.

As illustrated in FIG. 6, the plurality of electrode terminals 36 are provided on the upper side in the z-direction of the semiconductor element A10 (element principal surface 30a side), and project upward. The shape as viewed in the z-direction (planar shape) of the electrode terminals 36 is not limited at all, but a circular shape, an elliptic shape (oval shape), a rectangular shape, a polygonal shape, or another shape is selected as the shape as viewed in the z-direction of the electrode terminals 36 as appropriate. In the present embodiment, each electrode terminal 36 has an identical circular shape as viewed in the z-direction. The dimensions and the like of the electrode terminals 36 are not limited at all. To cite an example thereof, the diameter of the electrode terminals 36 is 100 μm, for example. In addition, the plurality of electrode terminals 36 are each in contact with one electrode 341 through the opening 35a of the insulating layer 35. In the present embodiment, a central part as viewed in the z-direction of each electrode terminal 36 is in contact with the electrode 341, and a peripheral part as viewed in the z-direction of each electrode terminal 36 is superposed on the insulating layer 35. The plurality of electrode terminals 36 have conductivity. Each electrode terminal 36 is electrically connected to one of the switching circuit 321 and the control circuit 322 in the semiconductor layer 32 via the electrode 341, the plurality of vias 38, the internal electrode 37, and the wiring layer.

As illustrated in FIG. 6, each electrode terminal 36 includes a pillar portion 361 and a solder portion 362. The pillar portion 361 includes a seed layer 361a, a first plating layer 361b, and a second plating layer 361c. The seed layer 361a is in contact with the electrode 341 and the insulating layer 35, and includes Cu. The seed layer 361a is formed by electroless plating, for example. It is to be noted that the constituent material and forming method of the seed layer 361a are not limited. For example, the seed layer 361a may be formed by a sputtering method. The first plating layer 361b is laminated on the seed layer 361a and is formed of, for example, Cu or a Cu alloy. The first plating layer 361b is formed by electroplating. It is to be noted that the constituent material of the first plating layer 361b is not limited. The second plating layer 361c is laminated on the first plating layer 361b. The second plating layer 361c is interposed between the first plating layer 361b and the solder portion 362, and performs a function of inhibiting chemical combination reaction between the first plating layer 361b and the solder portion 362. The constituent material of the second plating layer 361c is not particularly limited. A metal that can inhibit the chemical combination reaction is selected as the constituent material of the second plating layer 361c as appropriate. For example, Ni or Fe is cited as the constituent material of the second plating layer 361c. In the present embodiment, the first plating layer 361b includes Cu, and the solder portion 362 includes Sn, so that the second plating layer 361c is formed of Ni, for example. In the present embodiment, the second plating layer 361c is formed by electroplating. It is to be noted that the constituent material and forming method of the second plating layer 361c are not limited. In addition, the second plating layer 361c may not necessarily be required. At the end surface of the pillar portion 361 (surface facing an opposite side from the electrode 341), a recessed portion 361d is formed such that a central portion of the end surface is recessed from a peripheral portion thereof.

The solder portion 362 has conductivity. The solder portion 362 is formed on the end surface of the pillar portion 361. In the present embodiment, the solder portion 362 is formed of solder including Sn (SnAg or the like), for example. The solder portion 362 is formed by electroplating. It is to be noted that the constituent material and forming method of the solder portion 362 are not limited.

Figure 8:
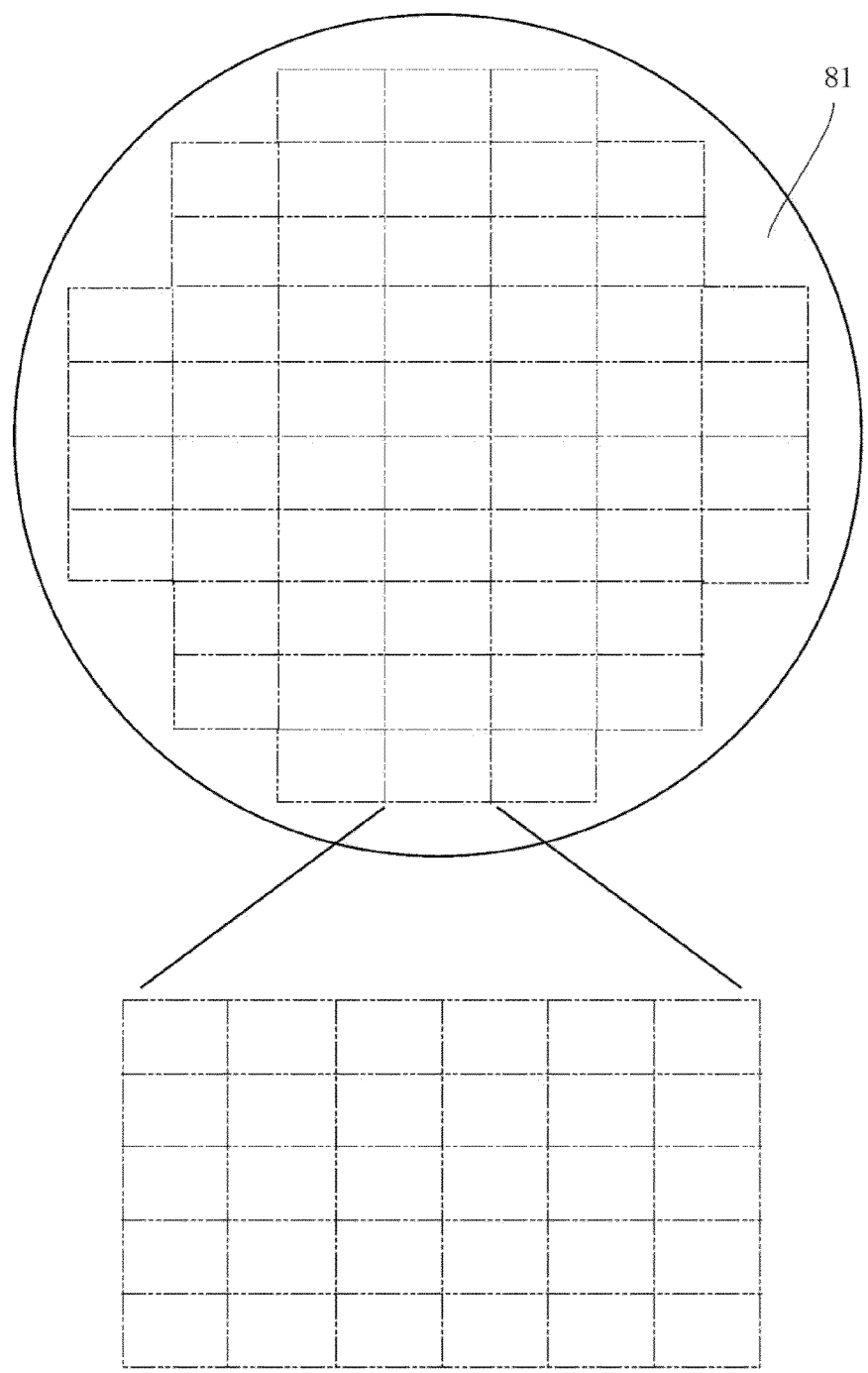
FIG. 8 is a plan view illustrating one process in an example of a method of manufacturing the semiconductor element of FIG. 1.
Figure 8:
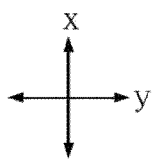
Figure 13:
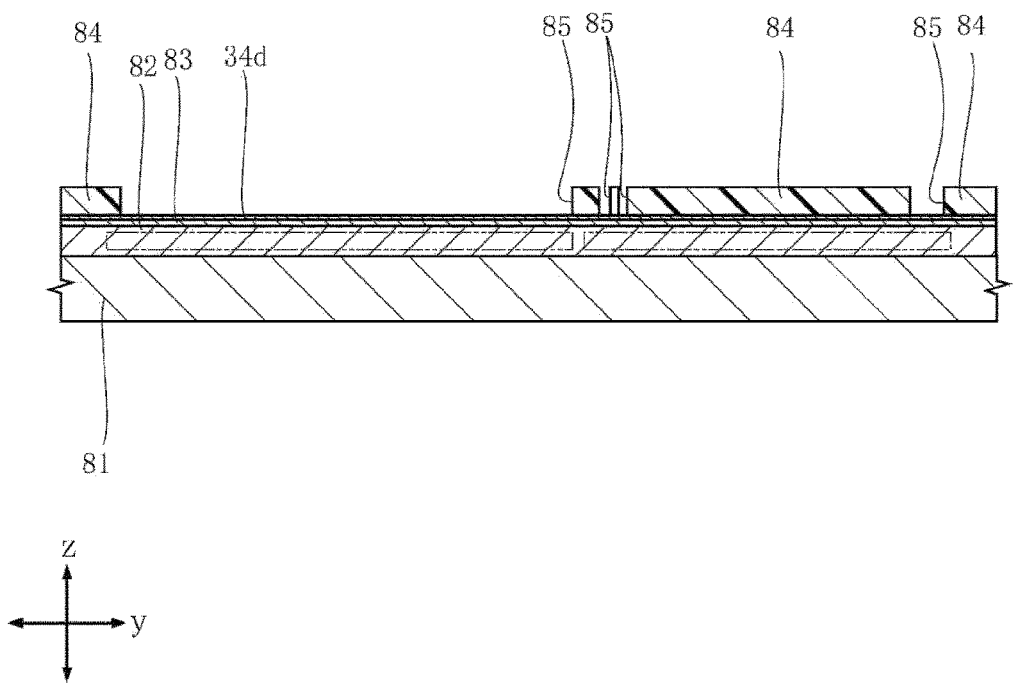
FIG. 13 is still another sectional view illustrating one process in an example of the method of manufacturing the semiconductor element of FIG. 1.
Figure 14:
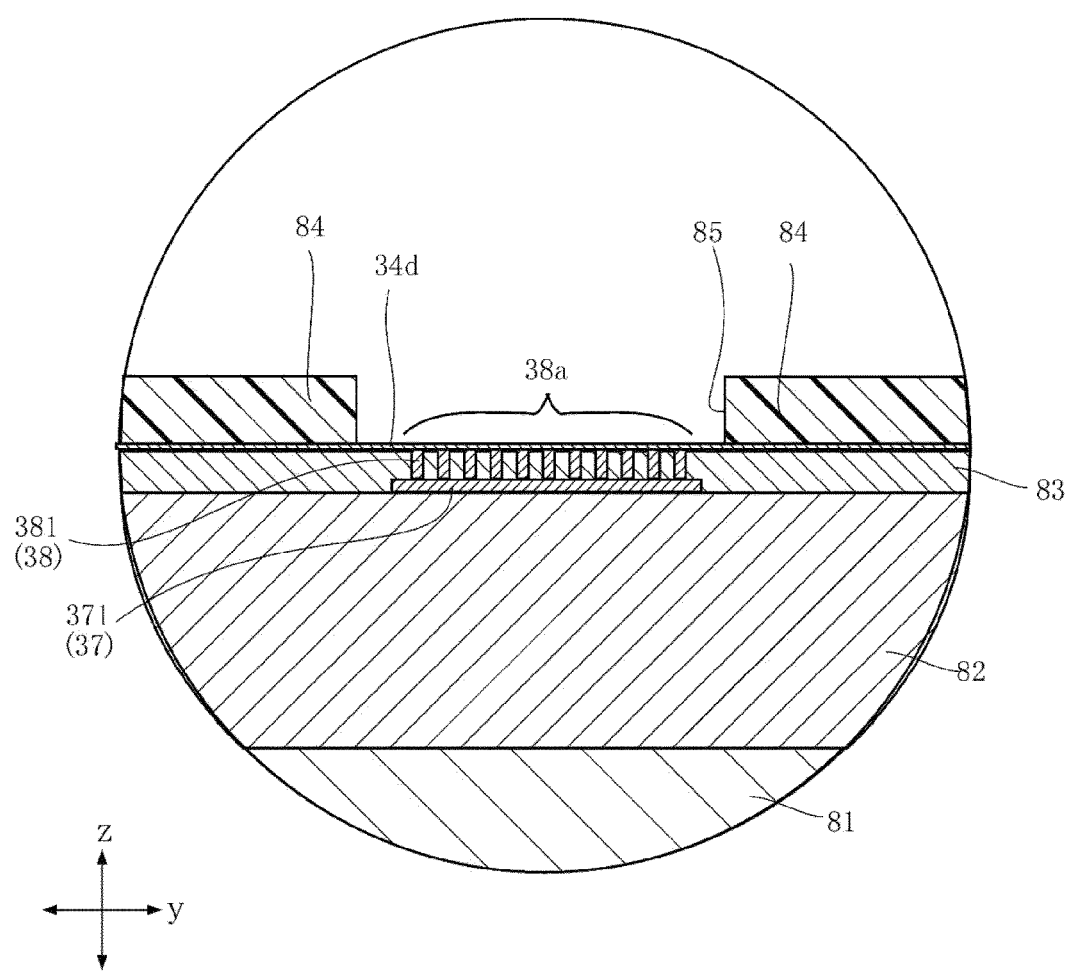
FIG. 14 is still another enlarged sectional view illustrating one process in an example of the method of manufacturing the semiconductor element of FIG. 1.
Figure 15:
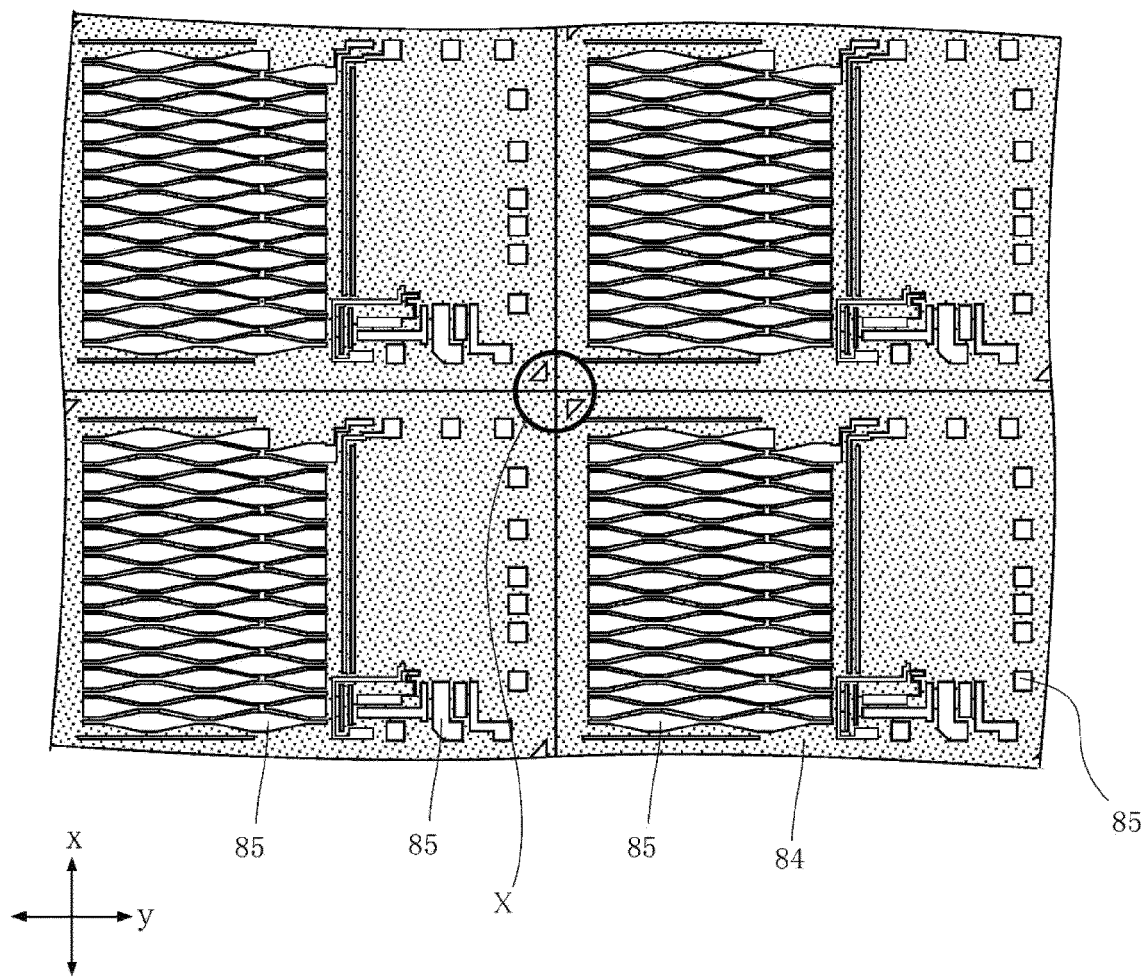
FIG. 15 is another plan view illustrating one process in an example of the method of manufacturing the semiconductor element of FIG. 1.
Figure 16:
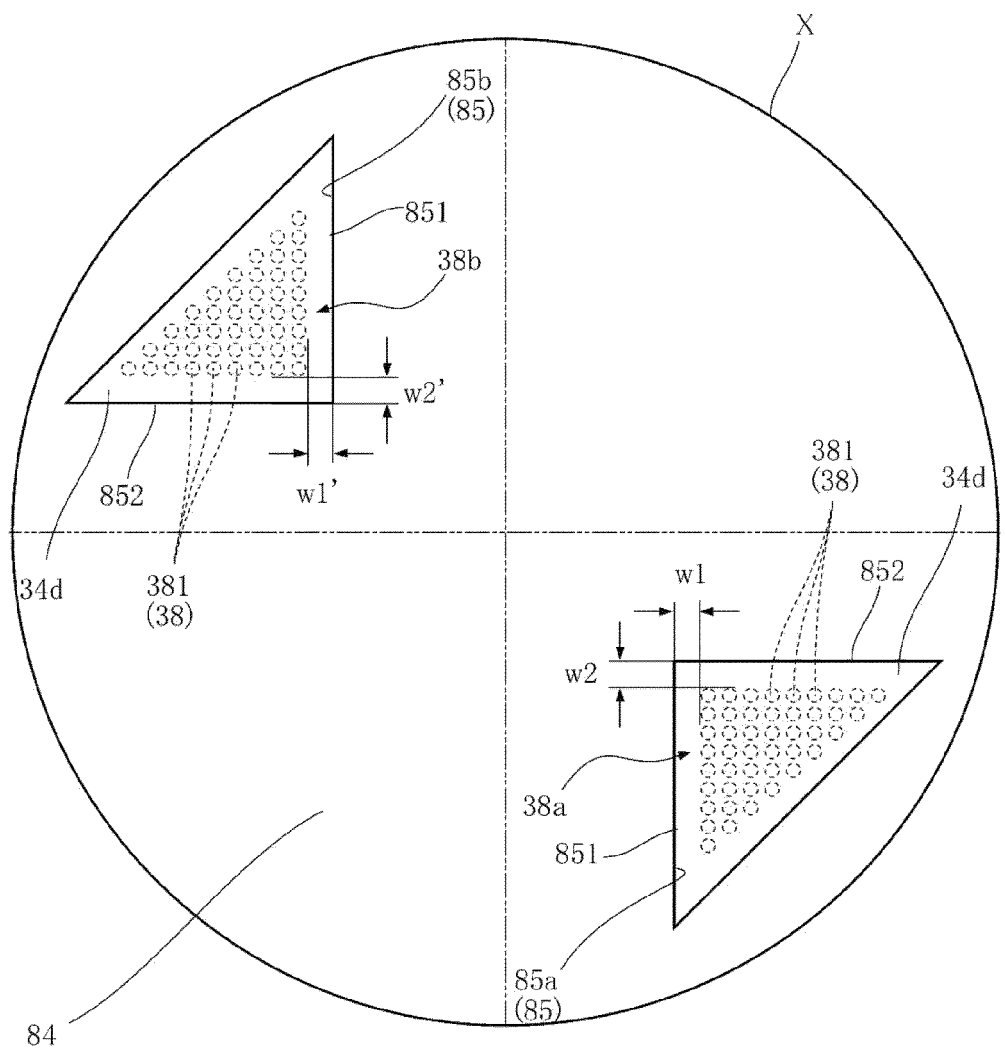
FIG. 16 is an enlarged plan view illustrating one process in an example of the method of manufacturing the semiconductor element of FIG. 1.

An example of a method of manufacturing the semiconductor element A10 will next be described in the following with reference to FIGS. 8 to 19. FIGS. 8 to 19 are each a diagram illustrating one process in the example of the method of manufacturing the semiconductor element A10. FIG. 8 and FIG. 15 are plan views. FIGS. 9, 10, 13, 18, and 19 are sectional views. FIGS. 11, 12, 14, and 17 are enlarged sectional views. FIG. 16 is an enlarged plan view.

First, as illustrated in FIG. 8, a semiconductor substrate 81 is prepared. The semiconductor substrate 81 includes a plurality of semiconductor substrates 31 connected to each other in directions orthogonal to the z-direction. The semiconductor substrate 81 is a silicon wafer, for example. FIG. 8 illustrates, by imaginary lines (chain double-dashed lines), boundary lines between shot regions to which an image of a photomask is transferred by light exposure in the semiconductor substrate 81. In the example of FIG. 8, the semiconductor substrate 81 includes 54 shot regions. One shot region includes a plurality of regions in which to form semiconductor elements A10. In a lower diagram in which one shot region is enlarged in FIG. 8, boundary lines between the regions in which to form the semiconductor elements A10 are indicated by imaginary lines (chain double-dashed lines). In the example of FIG. 8, one shot region includes regions in which to form 30 semiconductor elements A10. Hence, in the example of FIG. 8, one semiconductor substrate 81 includes regions in which to form 1620 semiconductor elements A10. It is to be noted that the number of shot regions included in the semiconductor substrate 81 and the number of regions that are included in the shot regions and in which to form the semiconductor elements A10 are not limited. In addition, the arrangement of each shot region in the semiconductor substrate 81 and the arrangement of the regions in which to form the semiconductor elements A10 in the shot regions are not limited.

Figure 9:
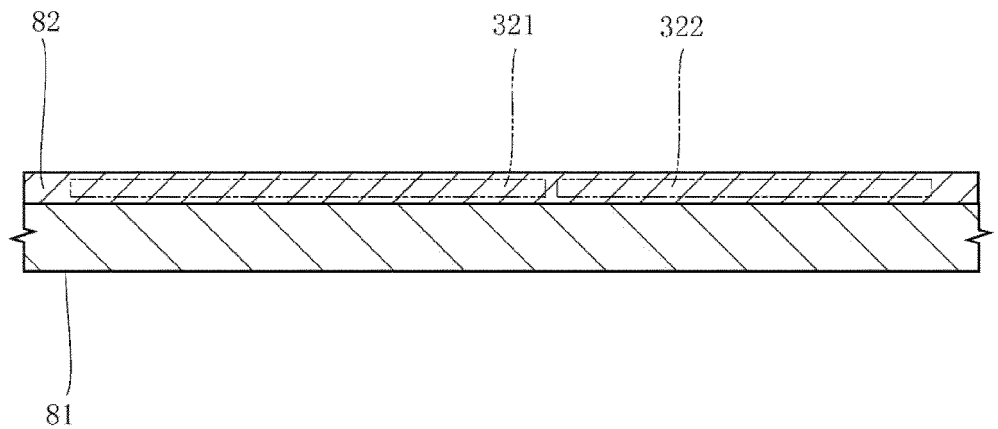
FIG. 9 is a sectional view illustrating one process in an example of the method of manufacturing the semiconductor element of FIG. 1.

Next, as illustrated in FIG. 9, a semiconductor layer 82 is laminated on the semiconductor substrate 81. The semiconductor layer 82 corresponds to the semiconductor layer 32 of the semiconductor element A10. The semiconductor layer 82 is formed by epitaxial growth, for example. The semiconductor layer 82 has a switching circuit 321 and a control circuit 322 formed therewithin.

Figure 10:
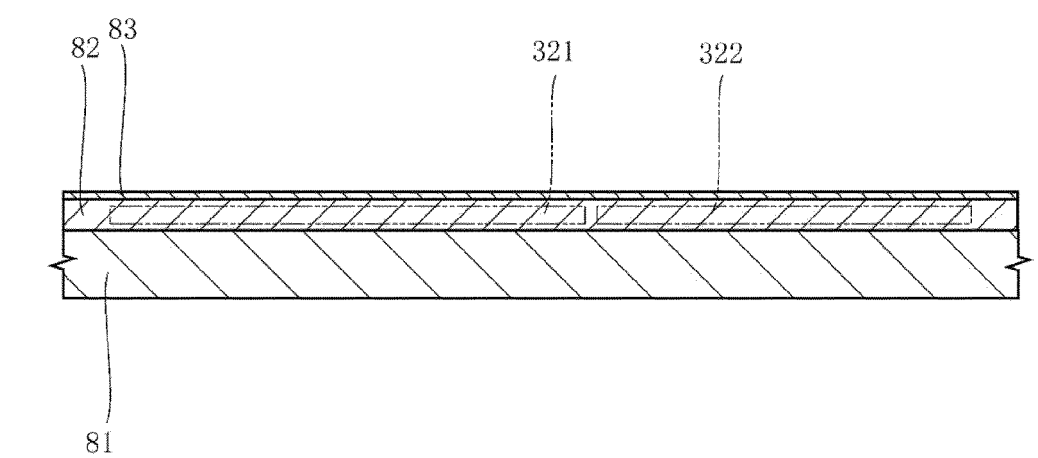
FIG. 10 is another sectional view illustrating one process in an example of the method of manufacturing the semiconductor element of FIG. 1.
Figure 11:
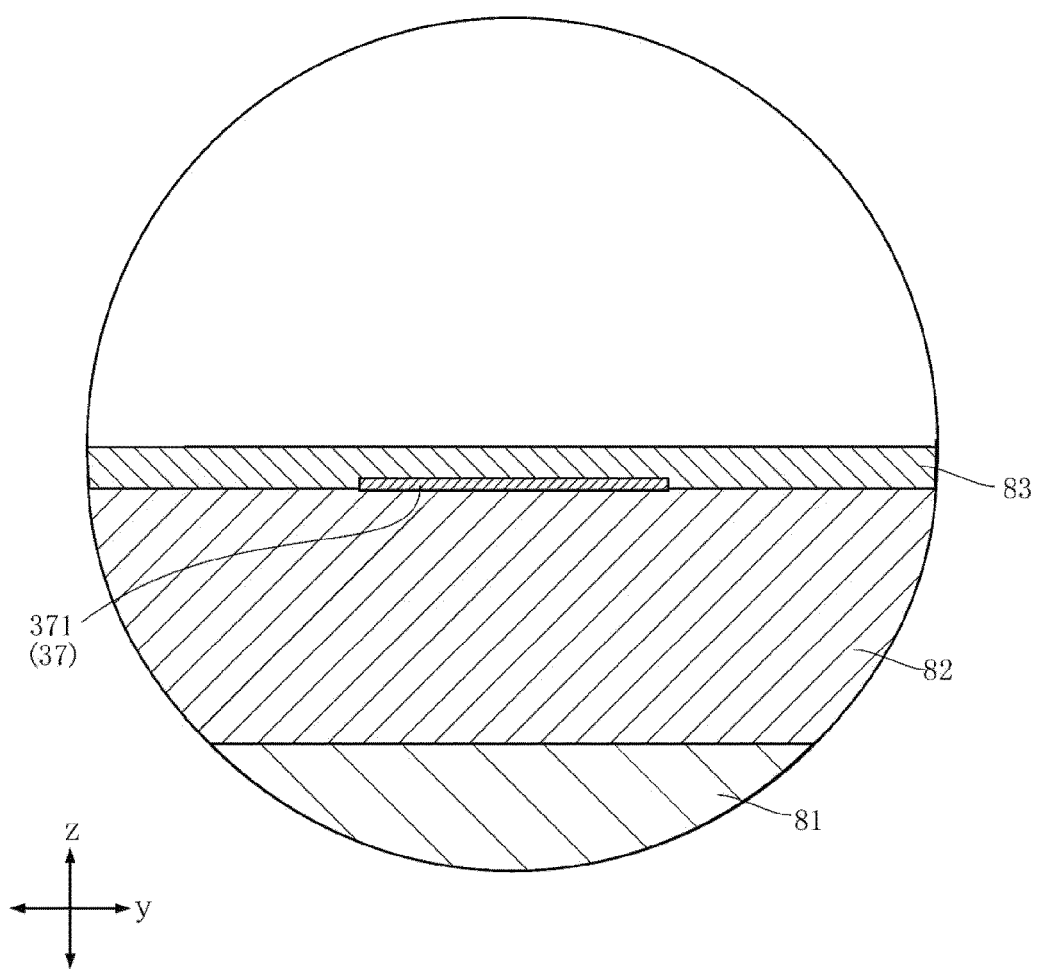
FIG. 11 is an enlarged sectional view illustrating one process in an example of the method of manufacturing the semiconductor element of FIG. 1.

Next, as illustrated in FIG. 10, a passivation film 83 is laminated on the semiconductor layer 82. The passivation film 83 corresponds to the passivation film 33 of the semiconductor element A10. As illustrated in FIG. 11, a plurality of internal electrodes 37 are formed at appropriate positions between the semiconductor layer 82 and the passivation film 83. The internal electrodes 37 are formed by electroless plating, for example. The passivation film 83 is formed by plasma chemical vapor deposition (CVD), for example. At this time, as illustrated in FIG. 11, internal electrodes 371 are respectively formed at positions corresponding to two corner portions on the diagonal line of each semiconductor element A10. Each internal electrode 371 is not electrically connected to the switching circuit 321 nor the control circuit 322 in the semiconductor layer 32.

Figure 12:
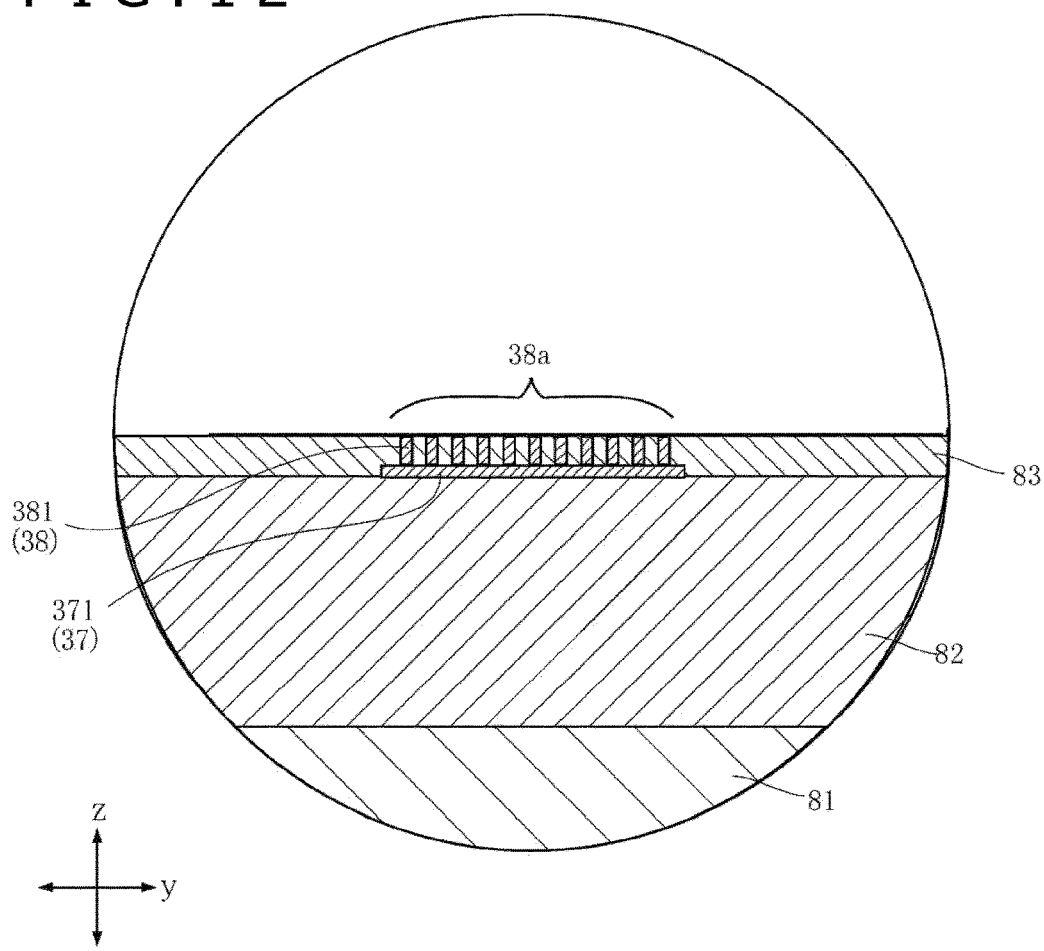
FIG. 12 is another enlarged sectional view illustrating one process in an example of the method of manufacturing the semiconductor element of FIG. 1.

Next, as illustrated in FIG. 12, a plurality of vias 38 are formed. The vias 38 are formed by first forming through holes penetrating the passivation film 83 and communicating with the internal electrodes 37, and forming a conductor including tungsten (W) or Cu, for example, on the inner walls of the through holes. At this time, as illustrated in FIG. 12, the plurality of vias 381 in contact with the internal electrode 371 are formed. An aggregate of these vias 381 constitutes a superimposition portion 38a whose general shape as viewed in the z-direction is the shape of a right triangle.

Next, a conductive layer 34 is formed. First, a seed layer 34d in contact with the passivation film 83 is formed. The seed layer 34d is formed of Cu and is formed by a sputtering method, for example. It is to be noted that the constituent material and forming method of the seed layer 34d are not limited. The seed layer 34d may be obtained by laminating a plurality of layers. Next, as illustrated in FIGS. 13 to 16, a resist 84 is formed on the seed layer 34d. The resist 84 is provided with openings 85 in regions in which to form the conductive layer 34. FIG. 13 is a sectional view, and illustrates a section corresponding to FIG. 2. FIG. 14 is an enlarged sectional view, and illustrates a section corresponding to FIG. 7. FIG. 15 is a plan view, in which the resist 84 is stippled. FIG. 16 is an enlarged plan view and is a diagram in which a region X encircled by a thick line in FIG. 15 is enlarged. In FIG. 16, boundary lines between regions in which to form respective semiconductor elements A10 are indicated by imaginary lines (chain double-dashed lines). The resist 84 is formed by applying a resist material so as to cover the whole surface of the seed layer 34d, applying a photolithography technology to perform patterning by transferring an image of a photomask, and thereby providing the openings 85.

Next, appropriateness of the position of each opening 85 of the resist 84 is inspected such that the conductive layer 34 can be formed at a correct position. As illustrated in FIG. 15 and FIG. 16, this inspection is performed in the region X having a center thereof at a point of intersection of regions in which to form four semiconductor elements A10. Incidentally, the inspection does not need to be performed in regions X at all intersection points, but the inspection is performed in a plurality of regions X (for example, nine regions X) set in advance on the semiconductor substrate 81.

As illustrated in FIG. 16, the region X includes a check opening 85a as an opening 85 for forming the check pattern 342a of a certain semiconductor element A10 and a check opening 85b as an opening 85 for forming the check pattern 342b of another semiconductor element A10. As viewed in the z-direction, a superimposition portion 38a included in the check opening 85a and a superimposition portion 38b included in the check opening 85b can be visually recognized by level differences of the plurality of vias 381 even after the thin seed layer 34d is formed. In the inspection in the region X, positional relation between the check opening 85a and the superimposition portion 38a and positional relation between the check opening 85b and the superimposition portion 38b as viewed in the z-direction are checked on the basis of an image obtained by imaging the region X, for example. Specifically, determination is made as to whether an interval w1 between an opening first side 851 of the check opening 85a which first side is parallel with the x-direction and the superimposition portion 38a falls within a predetermined range (for example, equal to or more than 20 μm and equal to or less than 30 μm) and whether an interval w2 between an opening second side 852 of the check opening 85a which second side is parallel with the y-direction and the superimposition portion 38a falls within a predetermined range (for example, equal to or more than 20 μm and equal to or less than 30 μm). In addition, determination is made as to whether an interval w1' between an opening first side 851 of the check opening 85b which first side is parallel with the x-direction and the superimposition portion 38b falls within a predetermined range (for example, equal to or more than 20 μm and equal to or less than 30 μm) and whether an interval w2' between an opening second side 852 of the check opening 85b which second side is parallel with the y-direction and the superimposition portion 38b falls within a predetermined range (for example, equal to or more than 20 μm and equal to or less than 30 μm). It is determined that the inspection is passed when all of the intervals w1, w2, w1', and w2' fall within the predetermined ranges. It is to be noted that the respective predetermined ranges of the intervals w1, w2, w1', and w2' are not limited, but may be different from each other.

Figure 17:
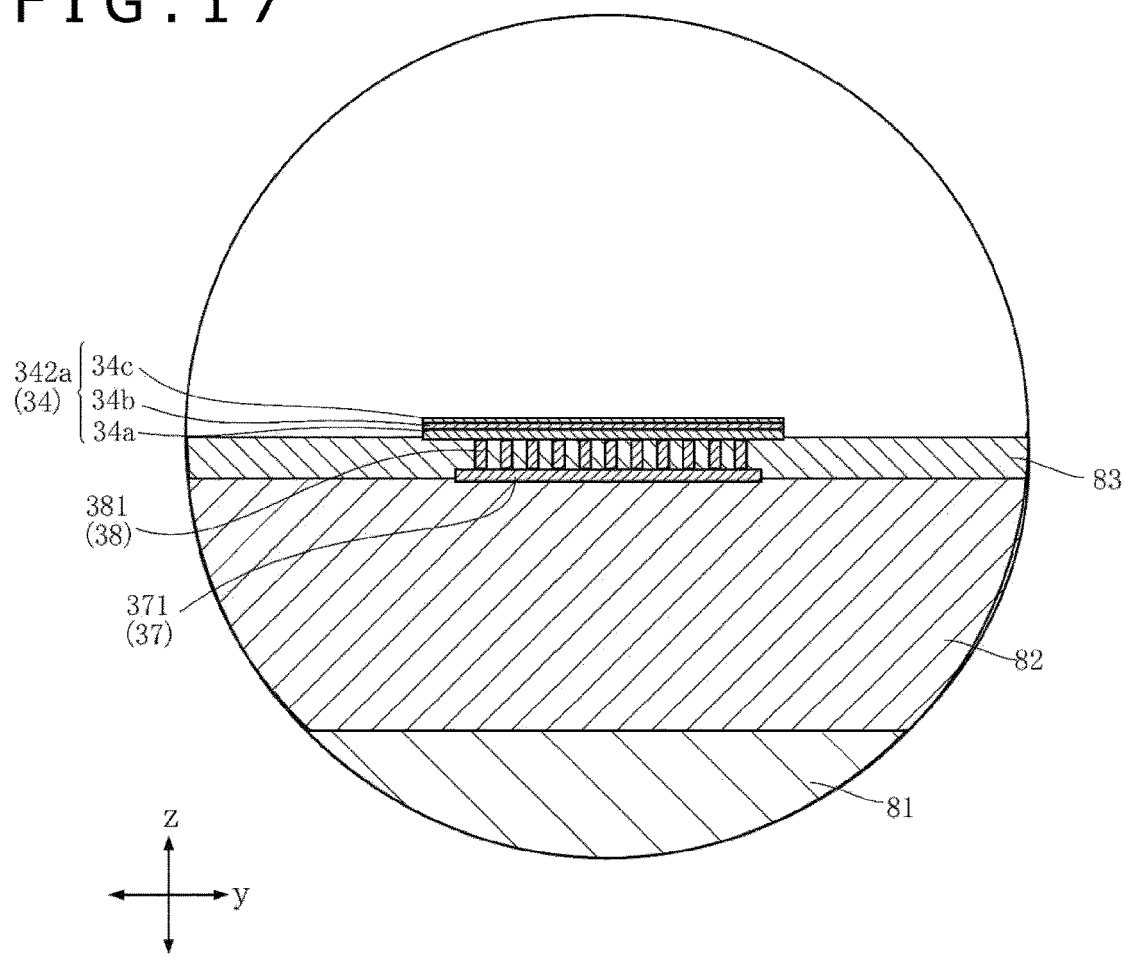
FIG. 17 is yet another enlarged sectional view illustrating one process in an example of the method of manufacturing the semiconductor element of FIG. 1.
Figure 18:
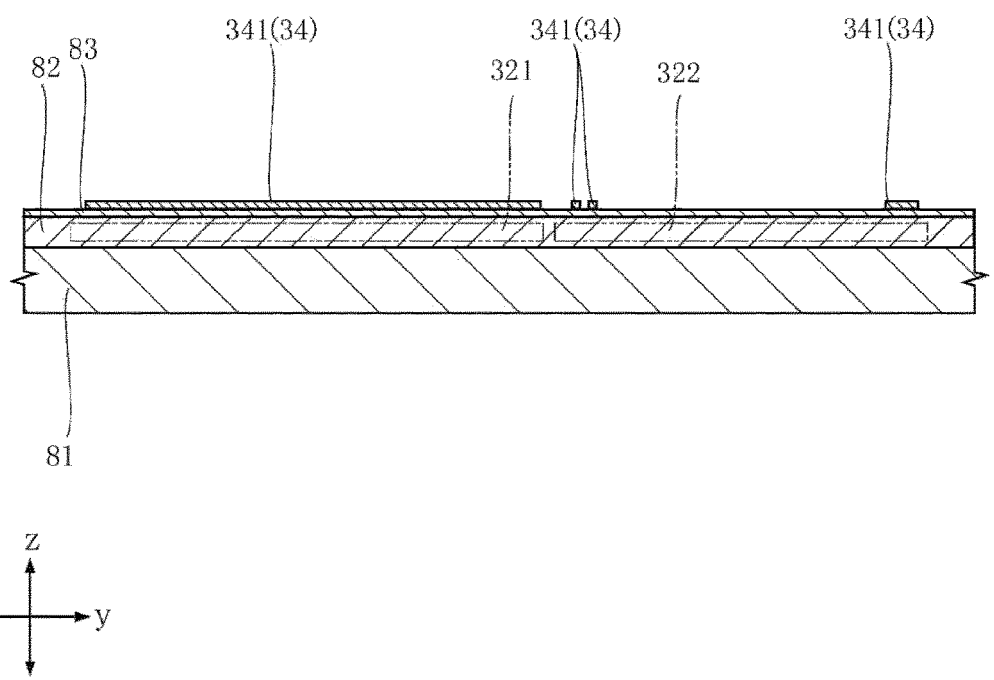
FIG. 18 is yet another sectional view illustrating one process in an example of the method of manufacturing the semiconductor element of FIG. 1.

When the inspection is passed, a plating layer 34e in contact with the seed layer 34d exposed from the openings 85 is formed. The plating layer 34e is formed of Cu and is formed by electroplating with the seed layer 34d as a conduction path. The plating layer 34e is integrated with the seed layer 34d to form a first layer 34a. Next, a second layer 34b in contact with the first layer 34a is formed. The second layer 34b is formed of Ni and is formed by electroplating. Next, a third layer 34c in contact with the second layer 34b is formed. The third layer 34c is formed of Pd and is formed by electroplating. Next, as illustrated in FIG. 17 and FIG. 18, the conductive layer 34 is formed by removing the resist 84 and the unnecessary seed layer 34d.

Figure 19:
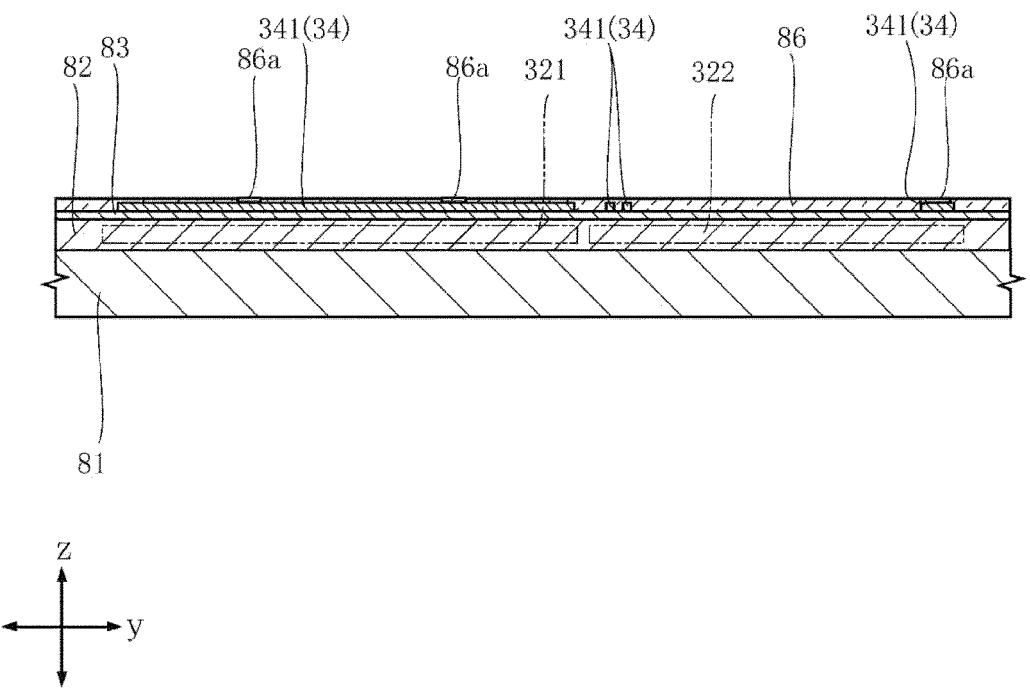
FIG. 19 is a further sectional view illustrating one process in an example of the method of manufacturing the semiconductor element of FIG. 1.

Next, as illustrated in FIG. 19, an insulating layer 86 covering the passivation film 83 and the conductive layer 34 is formed. A plurality of openings 86a penetrating in the z-direction are formed at appropriate positions in the insulating layer 86. The insulating layer 86 is, for example, formed by applying a photolithography technology to a photosensitive resin material applied by a spin coater. The insulating layer 86 corresponds to the insulating layer 35 of the semiconductor element A10. The openings 86a correspond to the openings 35a of the semiconductor element A10.

Next, a plurality of electrode terminals 36 in contact with the respective electrodes 341 through the openings 86a of the insulating layer 86 are formed. Next, the semiconductor substrate 81, the semiconductor layer 82, the passivation film 83, and the insulating layer 86 are divided into individual pieces by being cut by a dicing blade along cutting lines parallel with the x-direction and cutting lines parallel with the y-direction. As a result of the above processes, the semiconductor element A10 illustrated in FIGS. 1 to 7 is manufactured.

A semiconductor device B10 including the semiconductor element A10 will next be described.

Figure 20:
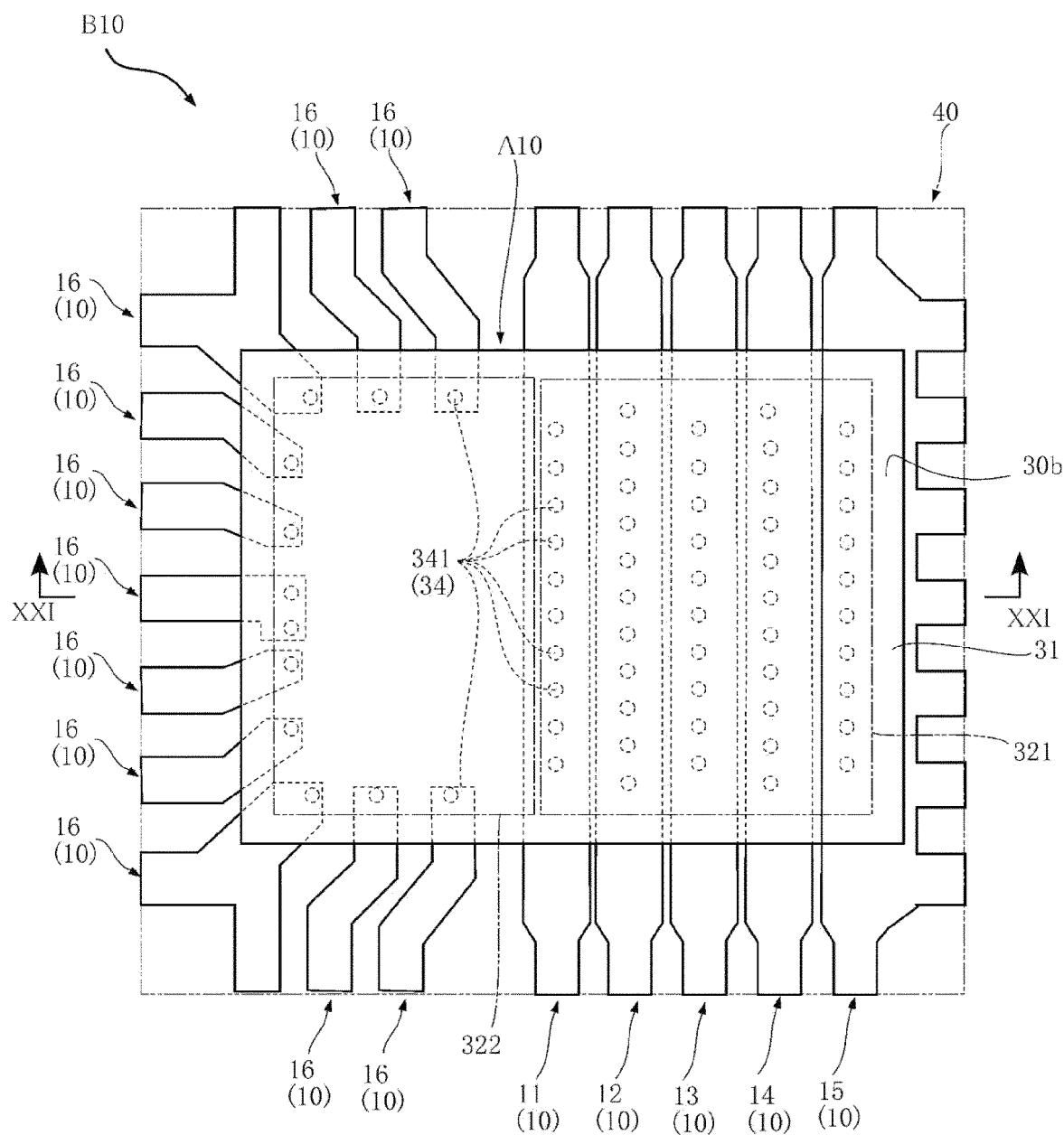
FIG. 20 is a plan view illustrating a semiconductor device including the semiconductor element of FIG. 1 and is a diagram in which a sealing resin is made transparent.
Figure 21:
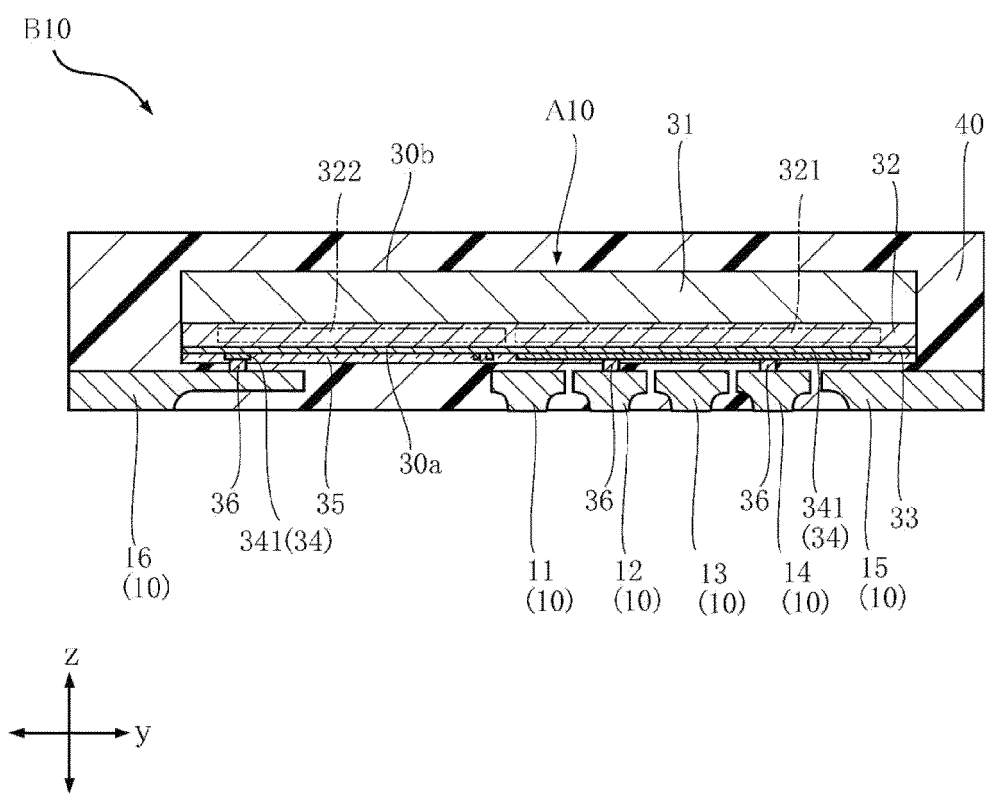
FIG. 21 is a sectional view taken along a line XXI-XXI in FIG. 20.

The semiconductor element A10 is, for example, provided as a semiconductor device flip chip bonded to a plurality of leads and covered by a sealing resin. FIG. 20 and FIG. 21 illustrate the semiconductor device B10 including the semiconductor element A10. The semiconductor device B10 includes the semiconductor element A10, a plurality of leads 10, and a sealing resin 40. FIG. 20 is a plan view illustrating the semiconductor device B10. In FIG. 20, for the convenience of understanding, the sealing resin 40 is made transparent, and the external shape of the sealing resin 40 is indicated by an imaginary line (chain double-dashed line). FIG. 21 is a sectional view taken along a line XXI-XXI in FIG. 20. The package type of the semiconductor device B10 is not particularly limited, but is a quad flat non-leaded package (QFN) type in the present embodiment, as illustrated in FIG. 20. In addition, uses and functions of the semiconductor device B10 are not limited at all. The uses of the semiconductor device B10 include an electronic apparatus use, an ordinary industrial apparatus use, a vehicle-mounted use, and other uses. In addition, the functions of the semiconductor device B10 suitably include, for example, those of a direct current to direct current (DC/DC) converter, an alternating current to direct current (AC/DC) converter, and the like.

As illustrated in FIG. 20, as viewed in the z-direction, the semiconductor element A10 is disposed at the center of the semiconductor device B10. The semiconductor element A10 is supported by the plurality of leads 10. The semiconductor element A10 has the element principal surface 30a flip chip bonded to the plurality of leads 10, and has each electrode 341 connected to one of the plurality of leads 10 via the electrode terminal 36. The semiconductor element A10 is covered by the sealing resin 40.

As illustrated in FIG. 20, the plurality of leads 10 support the semiconductor element A10. In addition, as illustrated in FIG. 21, the sealing resin 40 covers a part of each of the plurality of leads 10. A part of each of the leads 10 is exposed from the sealing resin 40 to form a terminal for mounting the semiconductor device B10 on a wiring board. The plurality of leads 10 are formed by performing etching processing, for example, on a metallic sheet of Cu or a Cu alloy, for example. The plurality of leads 10 are arranged so as to be spaced from each other. The plurality of leads 10 include leads 11 to 15 and a plurality of leads 16. The leads 11 to 15 are electrically connected to the switching circuit 321 of the semiconductor element A10. The plurality of leads 16 are each electrically connected to the control circuit 322 of the semiconductor element A10. It is to be noted that the number of the plurality of leads 10 is not limited, and that the shape and arrangement of each lead 10 are not limited.

The sealing resin 40 covers the whole of the semiconductor element A10 and a part of each of the plurality of leads 10. The sealing resin 40 is, for example, formed of a material including a black epoxy resin. It is to be noted that the material of the sealing resin 40 is not limited.

It is to be noted that the package type and structure of the semiconductor device including the semiconductor element A10 are not limited. In addition, the mounting method of the semiconductor element A10 is not limited to flip chip bonding. The semiconductor element A10 may be connected to each lead by wire or the like.

Actions and effects of the semiconductor element A10 will next be described.

According to the present embodiment, the conductive layer 34 includes the check pattern 342a and the check pattern 342b. In addition, the plurality of vias 38 include the plurality of vias 381. A part of the plurality of vias 381 constitute the superimposition portion 38a included in the check pattern 342a as viewed in the z-direction. The rest of the plurality of vias 381 constitute the superimposition portion 38b included in the check pattern 342b as viewed in the z-direction. In the process of forming the conductive layer 34, appropriateness of the position of each opening 85 of the resist 84 can be inspected by checking the positional relation between the check opening 85a and the superimposition portion 38a and the positional relation between the check opening 85b and the superimposition portion 38b as viewed in the z-direction. The check pattern 342a and the check pattern 342b are arranged at corner portions of the semiconductor element A10 (semiconductor substrate 31) as viewed in the z-direction, and are not formed in regions to be subjected to dicing. Hence, chipping originating from the check pattern 342a and the check pattern 342b does not occur during dicing in the manufacturing process. In addition, because no drop-in region needs to be provided within one shot of a photomask, a decrease in the number of semiconductor elements obtained can be suppressed.

In addition, according to the present embodiment, the check pattern 342a has, as a shape as viewed in the z-direction, the shape of a right triangle having the check first side 342a1 parallel with the substrate first side 311 and the check second side 342a2 parallel with the substrate second side 312. In addition, the check pattern 342b has, as a shape as viewed in the z-direction, the shape of a right triangle having the check first side 342b1 parallel with the substrate third side 313 and the check second side 342b2 parallel with the substrate fourth side 314. The check pattern 342a and the check pattern 342b are arranged at respective corner portions on a diagonal line of the semiconductor element A10 (semiconductor substrate 31) as viewed in the z-direction.

Hence, in the process of inspecting the resist 84, displacements in four directions (one side and another side in the x-direction and one side and another side in the y-direction) of each opening 85 of the resist 84 can be identified at a time by visually checking the region X.

In addition, according to the present embodiment, as viewed in the z-direction, the superimposition portion 38a is included in the check pattern 342a, and the superimposition portion 38b is included in the check pattern 342b. Hence, the check opening 85a of the resist 84 and displacement of the check opening 85a are easily identified in the process of inspecting the resist 84.

In addition, according to the present embodiment, the check pattern 342a and the check pattern 342b are arranged at corner portions of the semiconductor element A10 (semiconductor substrate 31) as viewed in the z-direction, and therefore do not interfere with the arrangement of the electrodes 341.

FIGS. 22 to 28 illustrate other embodiments of the present disclosure. Incidentally, in these figures, elements identical or similar to those in the foregoing embodiment are identified by the same reference numerals as in the foregoing embodiment.

Second Embodiment

Figure 22:
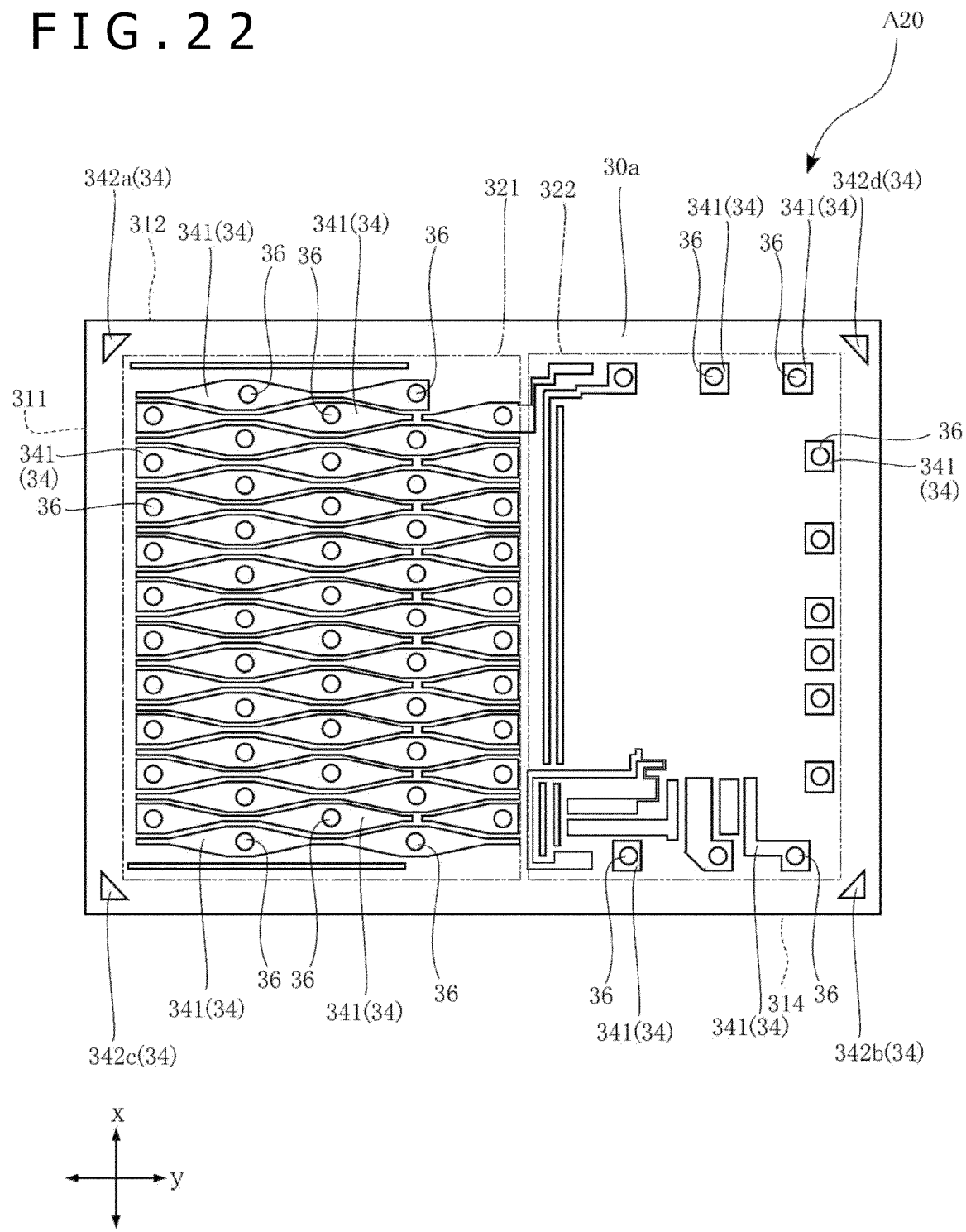
FIG. 22 is a plan view illustrating a semiconductor element according to a second embodiment of the present disclosure and is a diagram in which a protective layer is made transparent.

FIG. 22 is a diagram of assistance in explaining a semiconductor element A20 according to a second embodiment of the present disclosure. FIG. 22 is a plan view illustrating the semiconductor element A20 and is a diagram corresponding to FIG. 1. In FIG. 22, for the convenience of understanding, the insulating layer 35 is made transparent. The semiconductor element A20 according to the present embodiment has the number of check patterns 342 different from that of the first embodiment.

In the present embodiment, the semiconductor element A20 has four check patterns 342. That is, in addition to the check pattern 342a and the check pattern 342a according to the first embodiment, the semiconductor element A20 further has a check pattern 342c and a check pattern 342d. In FIG. 22, the check pattern 342c is disposed at a lower left corner portion of the semiconductor element A20 (semiconductor substrate 31). In FIG. 22, the check pattern 342d is disposed at an upper right corner portion of the semiconductor element A20 (semiconductor substrate 31). That is, the semiconductor element A20 has the check patterns 342 respectively arranged at all of the four corner portions as viewed in the z-direction. In addition, a plurality of vias 381 constituting a superimposition portion are arranged at each of positions included in the check pattern 342c and the check pattern 342d as viewed in the z-direction.

Also in the present embodiment, appropriateness of the position of each opening 85 of the resist 84 can be inspected in the process of forming the conductive layer 34. In addition, chipping originating from the check patterns 342a, 342b, 342c, and 342d does not occur during dicing in the manufacturing process, and a decrease in the number of semiconductor elements obtained can be suppressed.

In addition, according to the present embodiment, the check patterns 342a, 342b, 342c, and 342d each have the shape of a right triangle, and are respectively arranged at the four corner portions of the semiconductor element A10 (semiconductor substrate 31) as viewed in the z-direction. Hence, in the process of inspecting the resist 84, displacements in four directions of each opening 85 of the resist 84 can be identified at a time by visually checking the region X.

In addition, according to the present embodiment, the check patterns 342a, 342b, 342c, and 342d each include a superimposition portion as viewed in the z-direction. Therefore, displacement of each check opening of the resist 84 is easily identified in the process of inspecting the resist 84. In addition, the check patterns 342a, 342b, 342c, and 342d are arranged at the corner portions of the semiconductor element A20 (semiconductor substrate 31) as viewed in the z-direction, and therefore do not interfere with the arrangement of the electrodes 341.

Third Embodiment

Figure 23:
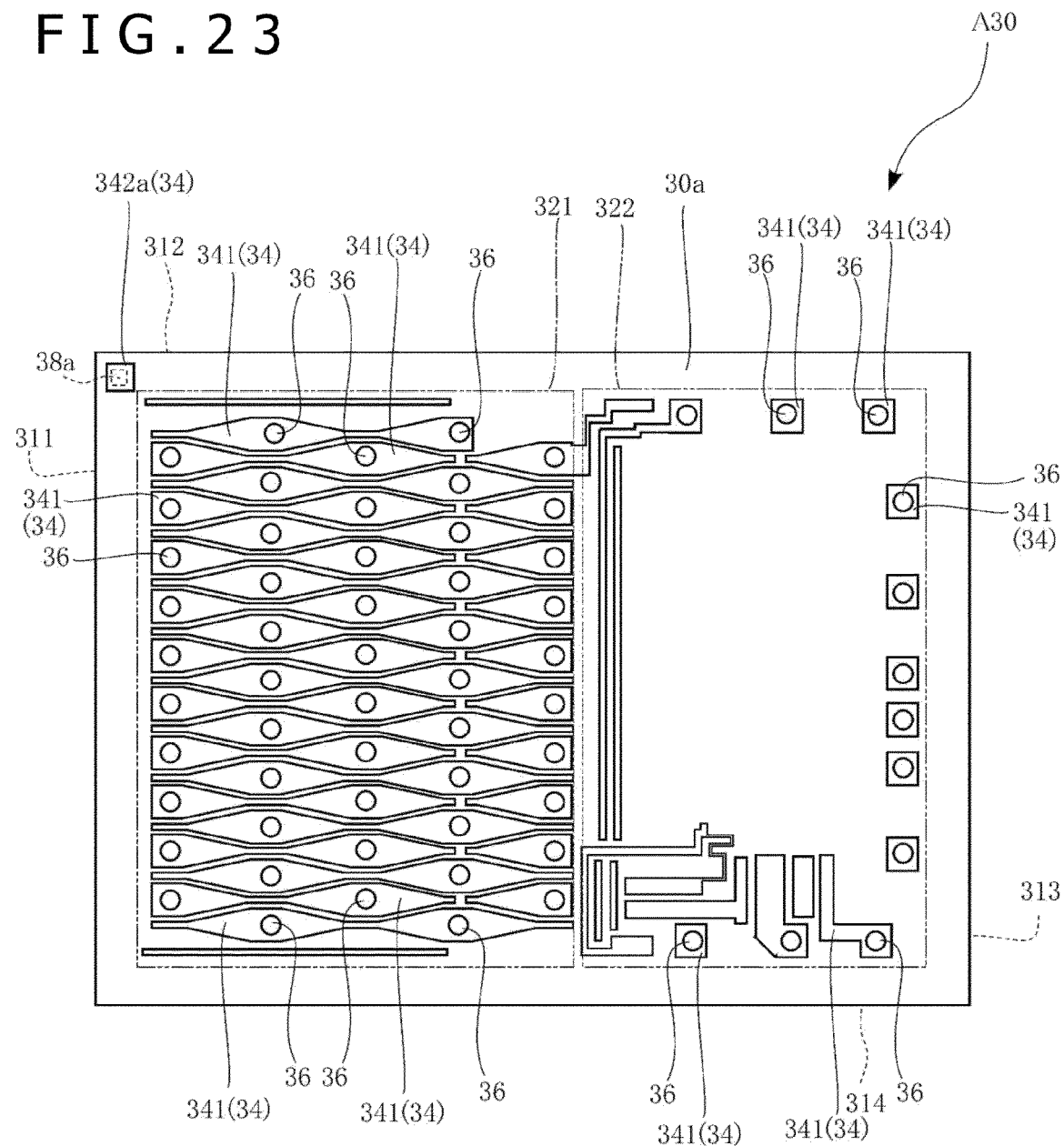
FIG. 23 is a plan view illustrating a semiconductor element according to a third embodiment of the present disclosure and is a diagram in which a protective layer is made transparent.

FIG. 23 is a diagram of assistance in explaining a semiconductor element A30 according to a third embodiment of the present disclosure. FIG. 23 is a plan view illustrating the semiconductor element A30 and is a diagram corresponding to FIG. 1. In FIG. 23, for the convenience of understanding, the insulating layer 35 is made transparent. In the semiconductor element A30 according to the present embodiment, the number and shape of check patterns 342 are different from those of the first embodiment.

In the present embodiment, the semiconductor element A30 has only one check pattern 342a. In FIG. 23, the check pattern 342a is disposed at an upper left corner portion of the semiconductor element A30 (semiconductor substrate 31). As viewed in the z-direction, the shape of the check pattern 342a is a quadrangular shape whose sides are each parallel with the x-direction or the y-direction. The shape as viewed in the z-direction of a superimposition portion 38a superimposed on the check pattern 342a as viewed in the z-direction is a quadrangular shape matched with the check pattern 342a and is included in the check pattern 342a.

Also in the present embodiment, appropriateness of the position of each opening 85 of the resist 84 can be inspected in the process of forming the conductive layer 34. In addition, chipping originating from the check pattern 342a does not occur during dicing in the manufacturing process, and a decrease in the number of semiconductor elements obtained can be suppressed.

In addition, according to the present embodiment, the shape of the check pattern 342a is a quadrangular shape whose sides are each parallel with the x-direction or the y-direction. Hence, in the process of inspecting the resist 84, displacements in four directions (one side and another side in the x-direction and one side and another side in the y-direction) of the openings 85 of the resist 84 can be identified at a time by visually checking the check opening 85a for forming the check pattern 342a.

In addition, according to the present embodiment, as viewed in the z-direction, the check pattern 342a includes the superimposition portion 38a. Thus, displacement of the check opening 85a of the resist 84 is easily identified in the process of inspecting the resist 84. In addition, the check pattern 342a is disposed at a corner portion of the semiconductor element A30 (semiconductor substrate 31) as viewed in the z-direction, and therefore does not interfere with the arrangement of the electrodes 341.

Fourth Embodiment

Figure 24:
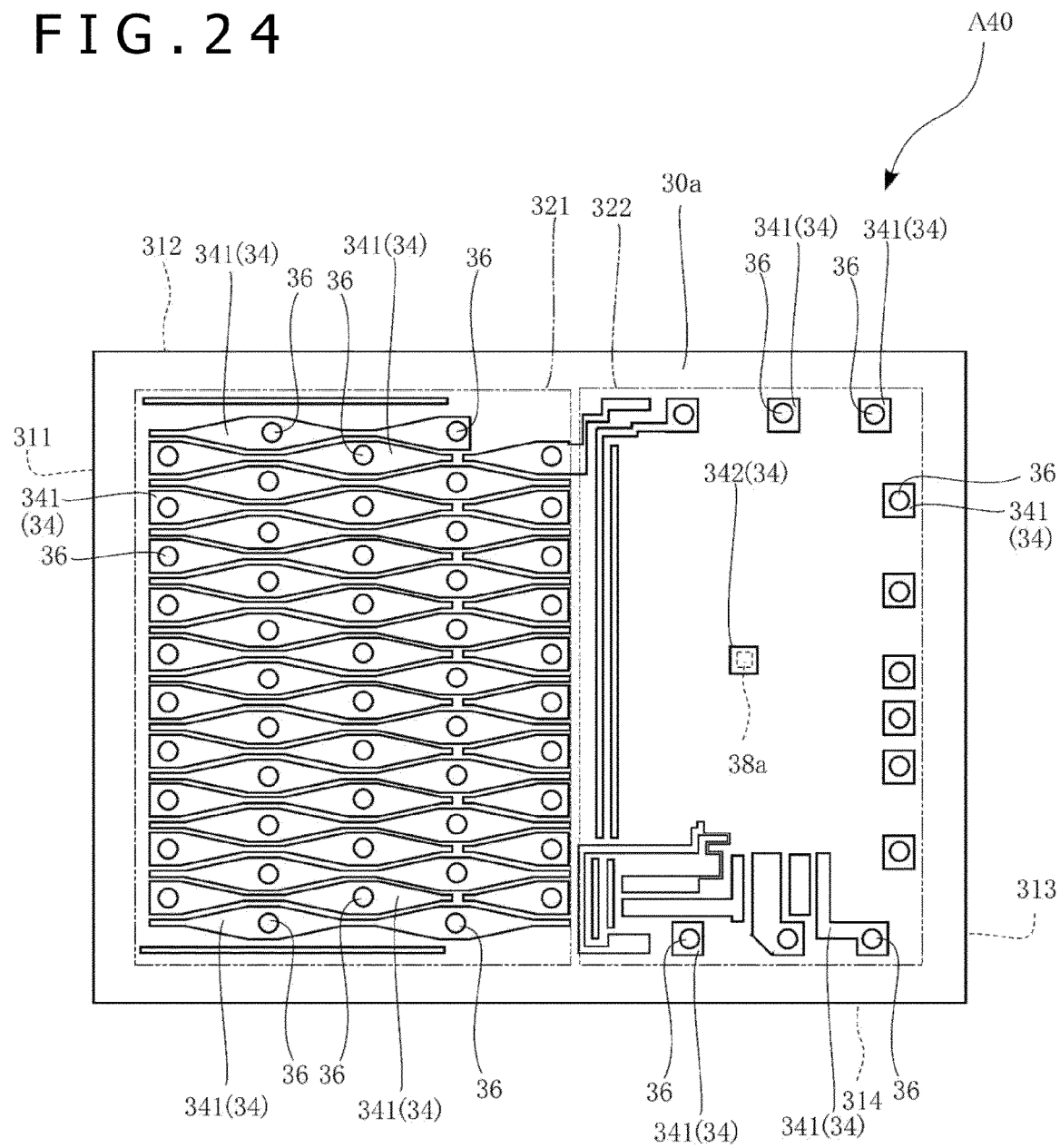
FIG. 24 is a plan view illustrating a semiconductor element according to a fourth embodiment of the present disclosure and is a diagram in which a protective layer is made transparent.

FIG. 24 is a diagram of assistance in explaining a semiconductor element A40 according to a fourth embodiment of the present disclosure. FIG. 24 is a plan view illustrating the semiconductor element A40 and is a diagram corresponding to FIG. 1. In FIG. 24, for the convenience of understanding, the insulating layer 35 is made transparent. In the semiconductor element A40 according to the present embodiment, the position of the check pattern 342 is different from that of the third embodiment.

In the present embodiment, the semiconductor element A40 has only one check pattern 342a. In FIG. 24, the check pattern 342a is disposed at a position at which no electrodes 341 are formed, the position being near to the right side in the y-direction of the semiconductor element A30 (semiconductor substrate 31) and being the center in the x-direction of the semiconductor element A30 (semiconductor substrate 31). As viewed in the z-direction, the shape of the check pattern 342a is a quadrangular shape whose sides are each parallel with the x-direction or the y-direction. The shape as viewed in the z-direction of a superimposition portion 38a superimposed on the check pattern 342a as viewed in the z-direction is a quadrangular shape matched with the check pattern 342a and is included in the check pattern 342a.

Also in the present embodiment, appropriateness of the position of each opening 85 of the resist 84 can be inspected in the process of forming the conductive layer 34. In addition, chipping originating from the check pattern 342a does not occur during dicing in the manufacturing process, and a decrease in the number of semiconductor elements obtained can be suppressed.

In addition, according to the present embodiment, the shape of the check pattern 342a is a quadrangular shape whose sides are each parallel with the x-direction or the y-direction. Hence, in the process of inspecting the resist 84, displacements in four directions of the opening 85 of the resist 84 can be identified at a time by visually checking the check opening 85a for forming the check pattern 342a.

In addition, according to the present embodiment, as viewed in the z-direction, the check pattern 342a includes the superimposition portion 38a. Thus, displacement of the check opening 85a of the resist 84 is easily identified in the process of inspecting the resist 84.

It is to be noted that the arrangement position of the check pattern 342a is not limited, but may be at an end portion in the x-direction or an end portion in the y-direction. While each check pattern 342 is preferably disposed at a corner portion of the semiconductor substrate 31 as viewed in the z-direction as in the first to third embodiments, each check pattern 342 may be disposed anywhere unless interfering with the arrangement of the electrodes 341.

Fifth Embodiment

Figure 25:
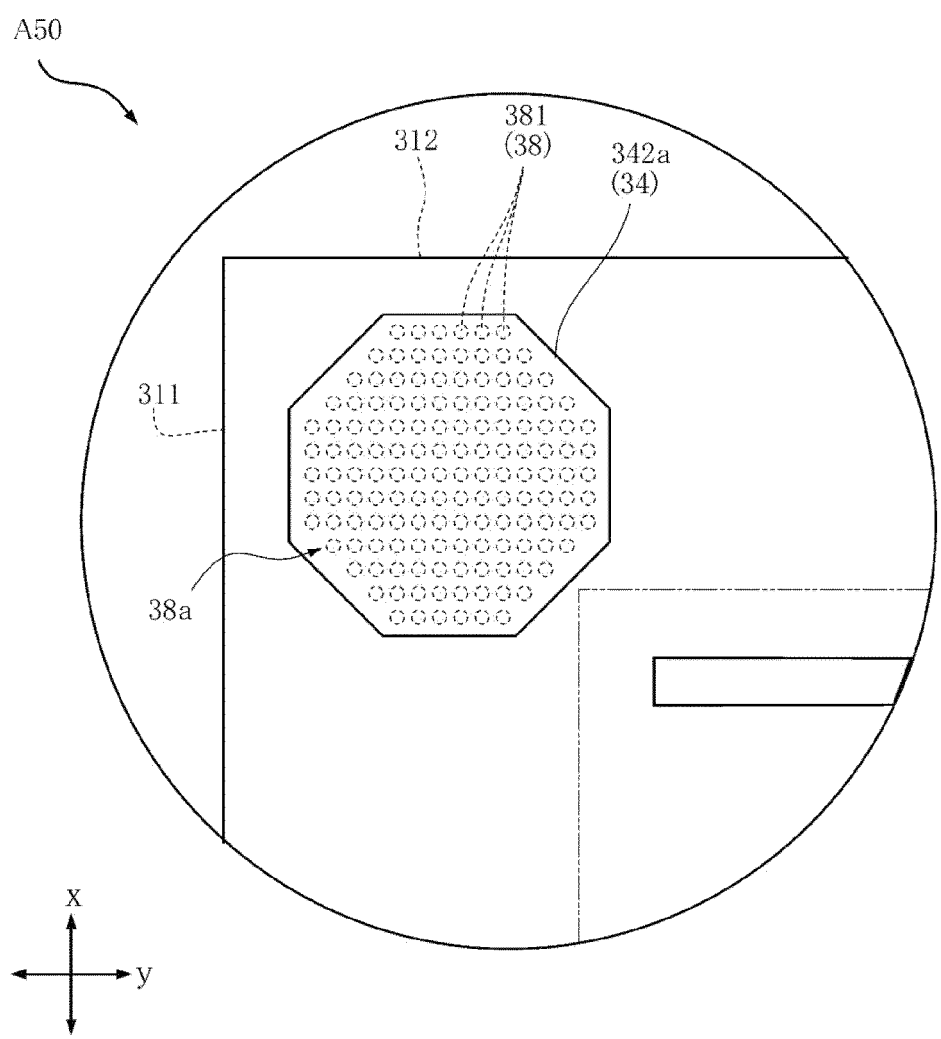
FIG. 25 is an enlarged plan view illustrating a semiconductor element according to a fifth embodiment of the present disclosure and is a diagram in which a protective layer is made transparent.

FIG. 25 is a diagram of assistance in explaining a semiconductor element A50 according to a fifth embodiment of the present disclosure. FIG. 25 is an enlarged plan view illustrating the semiconductor element A50 and is a diagram corresponding to FIG. 4. In FIG. 25, for the convenience of understanding, the insulating layer 35 is made transparent. In the semiconductor element A50 according to the present embodiment, the shape of the check pattern 342 is different from that of the third embodiment.

In the present embodiment, the semiconductor element A50 has only one check pattern 342a. In FIG. 25, the check pattern 342a is disposed at an upper left corner portion of the semiconductor element A50 (semiconductor substrate 31). As viewed in the z-direction, the shape of the check pattern 342a is a regular octagonal shape having two sides parallel with the x-direction and having two other sides parallel with the y-direction. The shape as viewed in the z-direction of a superimposition portion 38a superimposed on the check pattern 342a as viewed in the z-direction is a regular octagonal shape matched with the check pattern 342*a* and is included in the check pattern 342*a*.

Also in the present embodiment, appropriateness of the position of each opening 85 of the resist 84 can be inspected in the process of forming the conductive layer 34. In addition, chipping originating from the check pattern 342*a* does not occur during dicing in the manufacturing process, and a decrease in the number of semiconductor elements obtained can be suppressed.

In addition, according to the present embodiment, the shape of the check pattern 342*a* is a regular octagonal shape. Hence, in the process of inspecting the resist 84, displacements in eight directions of the opening 85 of the resist 84 can be identified at a time by visually checking the check opening 85*a* for forming the check pattern 342*a*.

In addition, according to the present embodiment, as viewed in the z-direction, the check pattern 342*a* includes the superimposition portion 38*a*. Thus, displacement of the check opening 85*a* of the resist 84 is easily identified in the process of inspecting the resist 84. In addition, the check pattern 342*a* is disposed at a corner portion of the semiconductor element A50 (semiconductor substrate 31) as viewed in the z-direction, and therefore does not interfere with the arrangement of the electrodes 341.

It is to be noted that the shape as viewed in the z-direction of the check pattern 342*a* is not limited, but may be another polygonal shape.

Sixth Embodiment

Figure 26:
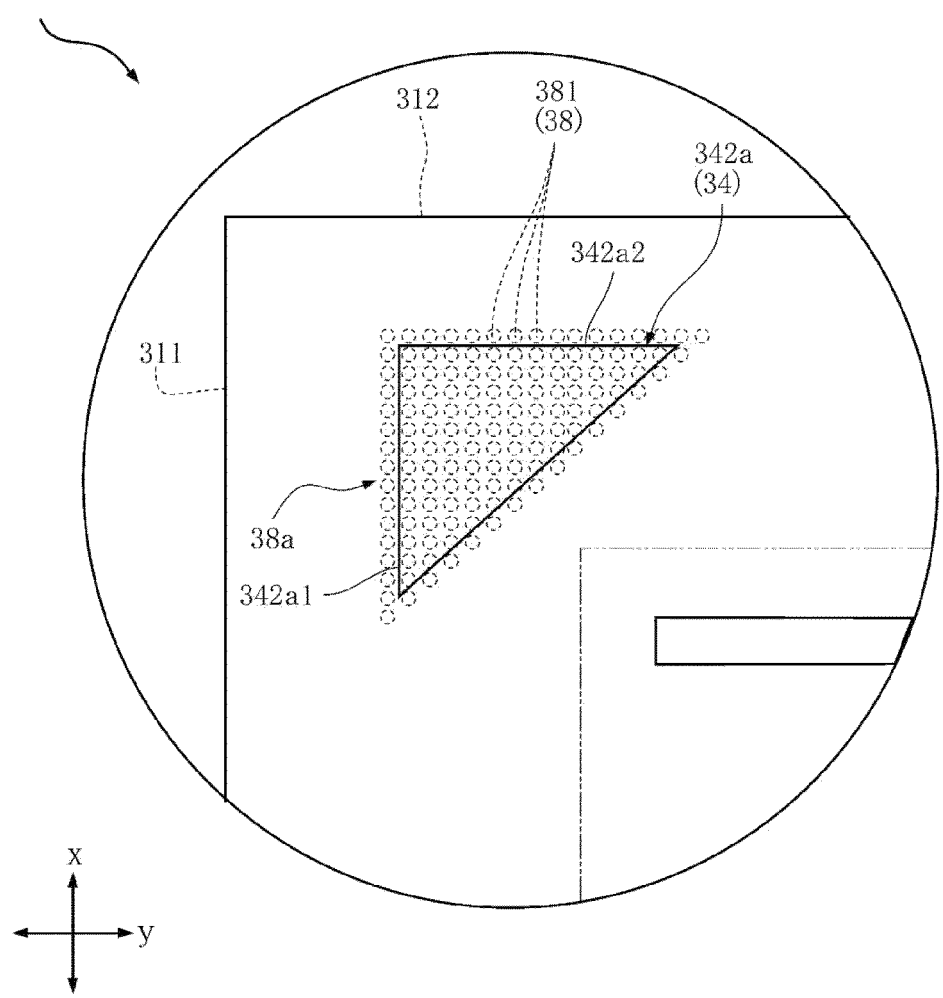
FIG. 26 is an enlarged plan view illustrating a semiconductor element according to a sixth embodiment of the present disclosure and is a diagram in which a protective layer is made transparent.

FIG. 26 is a diagram of assistance in explaining a semiconductor element A60 according to a sixth embodiment of the present disclosure. FIG. 26 is an enlarged plan view illustrating the semiconductor element A60 and is a diagram corresponding to FIG. 4. In FIG. 26, for the convenience of understanding, the insulating layer 35 is made transparent. The semiconductor element A60 according to the present embodiment is different from the first embodiment in that the check pattern 342*a* is included in the superimposition portion 38*a* as viewed in the z-direction.

In the present embodiment, as viewed in the z-direction, the superimposition portion 38*a* is not included in the check pattern 342*a*, but conversely the superimposition portion 38*a* includes the check pattern 342*a*. The superimposition portion 38*a* is formed so as to extend off the check first side 342*a*1 and the check second side 342*a*2 by a predetermined amount. Though not illustrated in FIG. 26, as viewed in the z-direction, the superimposition portion 38*b* also includes the check pattern 342*b* and is formed so as to extend off the check first side 342*b*1 and the check second side 342*b*2 by a predetermined amount.

According to the present embodiment, it can be determined that the position of each opening 85 of the resist 84 is displaced by a predetermined amount or more in a case where a part other than the superimposition portion 38*a* is exposed from the check opening 85*a* when the check opening 85*a* is visually checked from the z-direction in the inspecting process of the process of forming the conductive layer 34. Hence, appropriateness of the position of each opening 85 of the resist 84 can be inspected by checking the positional relation between the check opening 85*a* and the superimposition portion 38*a* and the positional relation between the check opening 85*b* and the superimposition portion 38*b* as viewed in the z-direction. In addition, chipping originating from the check pattern 342*a* and the check pattern 342*b* does not occur during dicing in the manufacturing process, and a decrease in the number of semiconductor elements obtained can be suppressed.

In addition, according to the present embodiment, the check pattern 342*a* and the check pattern 342*b* each have the shape of a right triangle, and are arranged at respective corner portions on a diagonal line of the semiconductor element A60 (semiconductor substrate 31) as viewed in the z-direction. Hence, in the process of inspecting the resist 84, displacements in four directions of each opening 85 of the resist 84 can be identified at a time by visually checking the region X. In addition, the check pattern 342*a* and the check pattern 342*b* are arranged at corner portions of the semiconductor element A60 (semiconductor substrate 31) as viewed in the z-direction, and therefore do not interfere with the arrangement of the electrodes 341.

Seventh Embodiment

Figure 27:
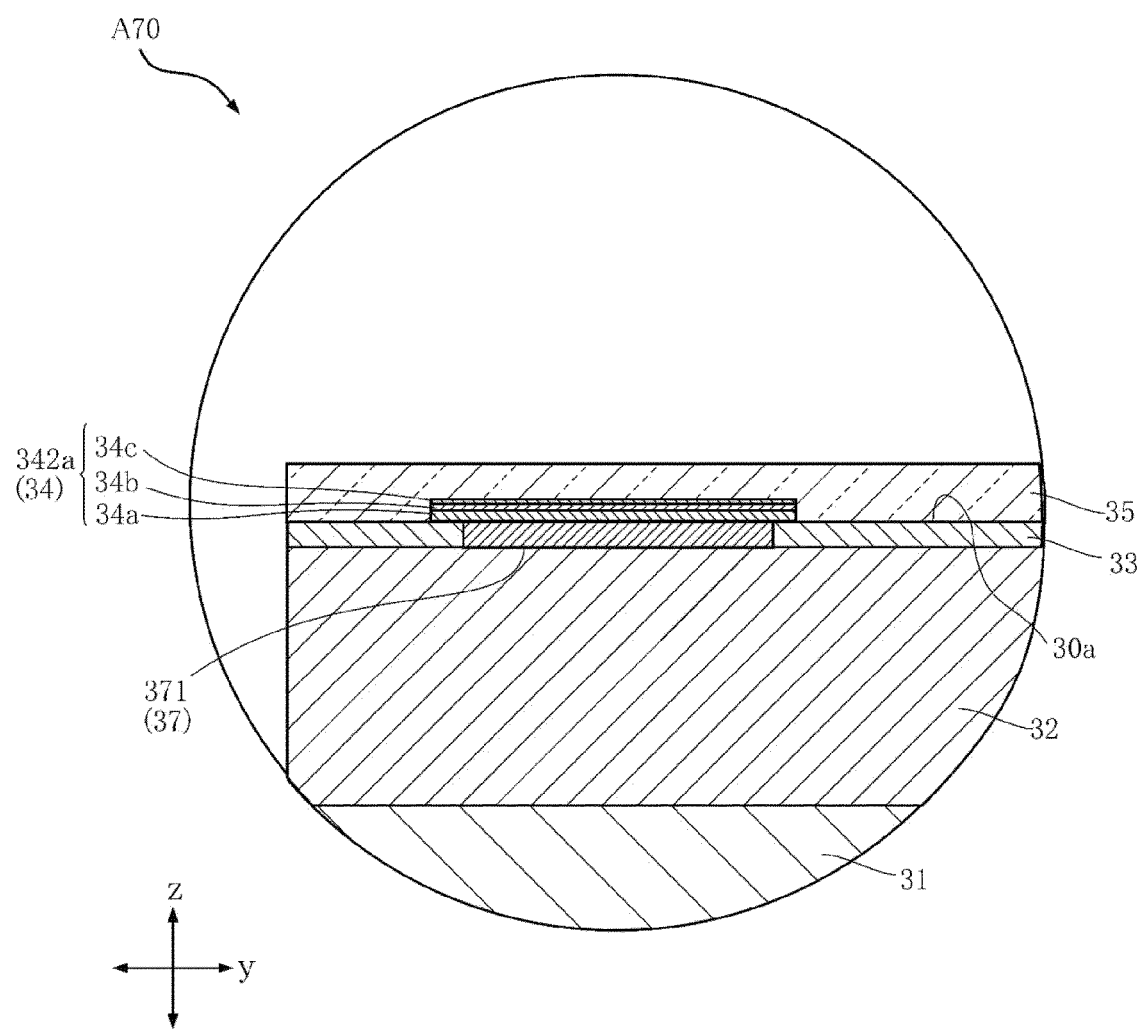
FIG. 27 is an enlarged sectional view illustrating a semiconductor element according to a seventh embodiment of the present disclosure.
Figure 28:
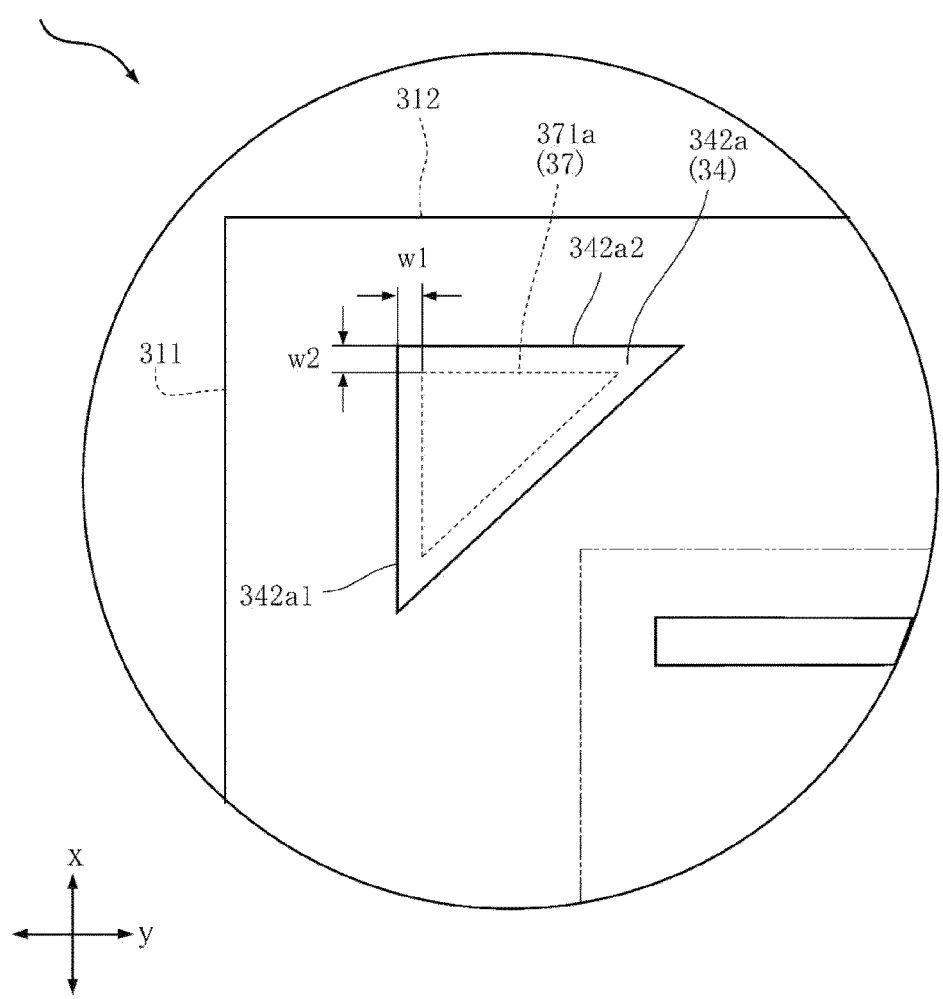
FIG. 28 is an enlarged plan view illustrating the semiconductor element according to the seventh embodiment of the present disclosure and is a diagram in which a protective layer is made transparent.

FIG. 27 and FIG. 28 are diagrams of assistance in explaining a semiconductor element A70 according to a seventh embodiment of the present disclosure. FIG. 27 is an enlarged sectional view illustrating the semiconductor element A70 and is a diagram corresponding to FIG. 7. FIG. 28 is an enlarged plan view illustrating the semiconductor element A70 and is a diagram corresponding to FIG. 4. The semiconductor element A70 according to the present embodiment is different from that of the first embodiment in that the semiconductor element A70 according to the present embodiment does not include the plurality of vias 38.

In the present embodiment, the plurality of vias 38 are not formed in the semiconductor element A70, but the plurality of internal electrodes 37 are in contact with the conductive layer 34. Hence, as illustrated in FIG. 27, the check pattern 342*a* is in contact with an internal electrode 371. In addition, the check pattern 342*b* are also in contact with an internal electrode 371. In addition, as illustrated in FIG. 28, the shape as viewed in the z-direction of an internal electrode 371*a* as the internal electrode 371 in contact with the check pattern 342*a* is a shape similar to that of the superimposition portion 38*a* according to the first embodiment and is included in the check pattern 342*a*. Though not illustrated in the figure, the shape as viewed in the z-direction of an internal electrode 371*b* as the internal electrode 371 in contact with the check pattern 342*b* is a shape similar to that of the superimposition portion 38*b* according to the first embodiment and is included in the check pattern 342*b*. In the present embodiment, the plurality of internal electrodes 37 correspond to a "second conductive layer" in the present disclosure, and the internal electrode 371*a* and the internal electrode 371*b* correspond to a "superimposition portion" in the present disclosure.

According to the present embodiment, in the process of forming the conductive layer 34, appropriateness of the position of each opening 85 of the resist 84 can be inspected by checking the positional relation between the check opening 85*a* and the internal electrode 371*a* and the positional relation between the check opening 85*b* and the internal electrode 371*b* as viewed in the z-direction. In addition, chipping originating from the check pattern 342*a* and the check pattern 342*b* does not occur during dicing in the manufacturing process, and a decrease in the number of semiconductor elements obtained can be suppressed.

In addition, according to the present embodiment, the check pattern 342*a* and the check pattern 342*b* each have the shape of a right triangle, and are arranged at respective corner portions on a diagonal line of the semiconductor element A70 (semiconductor substrate 31) as viewed in the z-direction. Hence, in the process of inspecting the resist 84, displacements in four directions of each opening 85 of the resist 84 can be identified at a time by visually checking the region X. In addition, according to the present embodiment, as viewed in the z-direction, the internal electrode 371*a* is included in the check pattern 342*a*, and the internal electrode 371*b* is included in the check pattern 342*b*. Hence, in the process of inspecting the resist 84, displacements of the check opening 85*a* and the check opening 85*a* of the resist 84 are easily identified. In addition, the check pattern 342*a* and the check pattern 342*b* are arranged at corner portions of the semiconductor element A60 (semiconductor substrate 31) as viewed in the z-direction, and therefore do not interfere with the arrangement of the electrodes 341.

The semiconductor element, the semiconductor device, and the semiconductor element manufacturing method according to the present disclosure are not limited to the foregoing embodiments. The concrete configuration of each part of the semiconductor element and the semiconductor device according to the present disclosure and the concrete processing of each step of the semiconductor element manufacturing method according to the present disclosure are capable of various design changes.

[Supplementary Note 1]

A semiconductor element including:
a semiconductor substrate;
a semiconductor layer laminated to the semiconductor substrate, and having a circuit formed within the semiconductor layer;
a conductive layer disposed on an opposite side of the semiconductor layer from the semiconductor substrate and including a part electrically connected to the circuit; and
a conductive portion disposed between the semiconductor layer and the conductive layer, and electrically connected to the conductive layer,
the conductive layer including a check pattern not electrically connected to the circuit,
the conductive portion including a superimposition portion superimposed on the check pattern as viewed in a thickness direction of the semiconductor substrate.

[Supplementary Note 2]

The semiconductor element according to supplementary note 1, in which
the superimposition portion is included in the check pattern as viewed in the thickness direction.

[Supplementary Note 3]

The semiconductor element according to supplementary note 1 or 2, in which
the conductive layer includes Cu.

[Supplementary Note 4]

The semiconductor element according to any one of supplementary notes 1 to 3, in which
the semiconductor substrate has a substrate first side extending in a first direction orthogonal to the thickness direction and a substrate second side extending in a second direction orthogonal to the thickness direction and the first direction, and
the check pattern has a check first side parallel with the substrate first side and a check second side parallel with the substrate second side.

[Supplementary Note 5]

The semiconductor element according to supplementary note 4, in which
the superimposition portion is formed by a plurality of conductors each having a rectangular shape as viewed in the first direction, and,
as viewed in the thickness direction, a general shape of the superimposition portion formed by the plurality of conductors has a superimposition portion first side parallel with the check first side.

[Supplementary Note 6]

The semiconductor element according to supplementary note 5, in which,
as viewed in the thickness direction, the general shape has a superimposition portion second side parallel with the check second side.

[Supplementary Note 7]

The semiconductor element according to any one of supplementary notes 1 to 6, in which,
as viewed in the thickness direction, a shape of the check pattern is a triangular shape.

[Supplementary Note 8]

The semiconductor element according to any one of supplementary notes 1 to 6, in which,
as viewed in the thickness direction, a shape of the check pattern is a quadrangular shape.

[Supplementary Note 9]

The semiconductor element according to any one of supplementary notes 1 to 8, in which
the check pattern is located at a corner portion of the semiconductor substrate as viewed in the thickness direction.

[Supplementary Note 10]

The semiconductor element according to supplementary note 9, in which
the conductive layer includes a second check pattern not electrically connected to the circuit,
the conductive portion includes a second superimposition portion superimposed on the second check pattern as viewed in the thickness direction, and
the second check pattern is located at a second corner portion on a diagonal line of the corner portion of the semiconductor substrate as viewed in the thickness direction.

[Supplementary Note 11]

The semiconductor element according to any one of supplementary notes 1 to 10, further including:
a passivation film interposed between the semiconductor layer and the conductive layer, in which
the conductive portion is a plurality of vias that penetrate the passivation film and are in contact with the conductive layer.

[Supplementary Note 12]

The semiconductor element according to any one of supplementary notes 1 to 10, in which
the conductive portion is a second conductive layer that is formed on the semiconductor layer and is in contact with the conductive layer.

[Supplementary Note 13]

The semiconductor element according to supplementary note 12, in which
the second conductive layer includes Al.

[Supplementary Note 14]

The semiconductor element according to any one of supplementary notes 1 to 13, further including:
an insulating layer that is in contact with the conductive layer and has an opening exposing a part of the conductive layer.

[Supplementary Note 15]

A semiconductor device including:
the semiconductor element according to any one of supplementary notes 1 to 14; and
a sealing resin that covers the semiconductor element.

[Supplementary Note 16]

A semiconductor element manufacturing method including:
  laminating, to a semiconductor substrate, a semiconductor layer having a circuit formed within the semiconductor layer and a passivation film;
  forming a plurality of vias penetrating the passivation film; and
  forming a conductive layer including a part electrically connected to the circuit via the plurality of vias,
  the conductive layer including a check pattern not electrically connected to the circuit,
  the plurality of vias including vias constituting a superimposition portion superimposed on the check pattern as viewed in a thickness direction of the semiconductor substrate,
  the forming the conductive layer including
    forming a seed layer in contact with the passivation film,
    forming, on the seed layer, a resist having a plurality of openings for forming the conductive layer, and
    checking positional relation between a check opening for forming the check pattern among the plurality of openings and the superimposition portion located in the check opening by a visual check from the thickness direction.

[Supplementary Note 17]

The semiconductor element manufacturing method according to supplementary note 16, in which
  the check opening has an opening first side parallel with a first direction orthogonal to the thickness direction and an opening second side parallel with a second direction orthogonal to the thickness direction and the first direction, and
  the checking measures an interval between the opening first side and the superimposition portion and measures an interval between the opening second side and the superimposition portion.

What is claimed is:

1. A semiconductor element comprising:
  a semiconductor substrate;
  a semiconductor layer laminated to the semiconductor substrate, and having a circuit formed within the semiconductor layer;
  a first conductive layer disposed on an opposite side of the semiconductor layer from the semiconductor substrate and including a part electrically connected to the circuit, wherein the first conductive layer is formed by a plurality of first layers laminated in a thickness direction of the semiconductor substrate; and
  a conductive portion disposed between the semiconductor layer and the first conductive layer, and electrically connected to the first conductive layer, wherein
    the conductive portion is formed by a plurality of first conductors each having a rectangular shape as viewed in a first direction orthogonal to the thickness direction,
    the first conductive layer includes a first check pattern not electrically connected to the circuit,
    the conductive portion includes a first superimposition portion superimposed on the first check pattern so as to be included in the first check pattern as viewed in the thickness direction of the semiconductor substrate, and
    the first superimposition portion is formed by a plurality of second conductors each having a rectangular shape as viewed in the first direction.

2. The semiconductor element according to claim 1, wherein the first conductive layer includes Cu.

3. The semiconductor element according to claim 1, wherein
  the semiconductor substrate has a substrate first side extending in the first direction and a substrate second side extending in a second direction orthogonal to the thickness direction and the first direction, and
  the first check pattern has a check first side parallel with the substrate first side and a check second side parallel with the substrate second side.

4. The semiconductor element according to claim 3, wherein
  as viewed in the thickness direction, a general shape of the first superimposition portion formed by the plurality of second conductors has a superimposition portion first side parallel with the check first side.

5. The semiconductor element according to claim 4, wherein,
  as viewed in the thickness direction, the general shape has a superimposition portion second side parallel with the check second side.

6. The semiconductor element according to claim 1, wherein,
  as viewed in the thickness direction, a shape of the first check pattern is a triangular shape.

7. The semiconductor element according to claim 1, wherein,
  as viewed in the thickness direction, a shape of the first check pattern is a quadrangular shape.

8. The semiconductor element according to claim 1, wherein
  the first check pattern is located at a first corner portion of the semiconductor substrate as viewed in the thickness direction.

9. The semiconductor element according to claim 8, wherein
  the first conductive layer further includes a second check pattern not electrically connected to the circuit,
  the conductive portion includes a second superimposition portion superimposed on the second check pattern as viewed in the thickness direction, and
  the second check pattern is located at a second corner portion on a diagonal line of the first corner portion of the semiconductor substrate as viewed in the thickness direction.

10. The semiconductor element according to claim 1, further comprising:
  a passivation film interposed between the semiconductor layer and the first conductive layer, wherein
    the conductive portion is formed by the plurality of first conductors that penetrate the passivation film and are in contact with the first conductive layer.

11. The semiconductor element according to claim 1, wherein
  the conductive portion is a second conductive layer that is formed on the semiconductor layer and is in contact with the first conductive layer.

12. The semiconductor element according to claim 11, wherein the second conductive layer includes Al.

13. The semiconductor element according to claim 1, further comprising:
  an insulating layer that is in contact with the first conductive layer and has an opening exposing a part of the first conductive layer.

14. A semiconductor device comprising:
  the semiconductor element according to claim 1; and a sealing resin that covers the semiconductor element;
laminating, to a semiconductor substrate, a semiconductor layer having a circuit formed within the semiconductor layer and a passivation film;
forming a plurality of vias penetrating the passivation film; and
forming a conductive layer including a part electrically connected to the circuit via the plurality of vias,
the conductive layer including a check pattern not electrically connected to the circuit,
the plurality of vias including vias constituting a superimposition portion superimposed on the check pattern as viewed in a thickness direction of the semiconductor substrate,
the forming the conductive layer including
forming a seed layer in contact with the passivation film,
forming, on the seed layer, a resist having a plurality of openings for forming the conductive layer, and
checking positional relation between a check opening for forming the check pattern among the plurality of openings and the superimposition portion located in the check opening by a visual check from the thickness direction.

15. The semiconductor element according to claim 1, further comprising an electrode pattern disposed on the semiconductor layer and not electrically connected to the circuit, wherein the plurality of first conductors is disposed on the electrode pattern.

16. The semiconductor element according to claim 15, wherein
a plurality of laminated layers of the first check pattern includes a first layer, a second layer, and a third layer laminated in this order of the thickness direction, and
the plurality of first conductors is in contact with both the electrode pattern and the first layer.

17. The semiconductor element according to claim 1, wherein the plurality of first conductors are arranged at a distance from the plurality of second conductors along a second direction which is orthogonal to both the thickness direction and the first direction.

* * * * *